US009941248B2

(12) United States Patent
Yang et al.

(10) Patent No.: US 9,941,248 B2
(45) Date of Patent: Apr. 10, 2018

(54) PACKAGE STRUCTURES, POP DEVICES AND METHODS OF FORMING THE SAME

(71) Applicant: Taiwan Semiconductor Manufacturing Co., Ltd., Hsinchu (TW)

(72) Inventors: Tien-Chung Yang, Hsinchu (TW); An-Jhih Su, Taoyuan (TW); Hsien-Wei Chen, Hsinchu (TW); Jo-Mei Wang, New Taipei (TW); Wei-Yu Chen, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/238,725

(22) Filed: Aug. 17, 2016

(65) Prior Publication Data

US 2017/0345795 A1   Nov. 30, 2017

Related U.S. Application Data

(60) Provisional application No. 62/343,018, filed on May 30, 2016.

(51) Int. Cl.
| | |
|---|---|
| *H01L 23/48* | (2006.01) |
| *H01L 25/065* | (2006.01) |
| *H01L 23/00* | (2006.01) |
| *H01L 23/31* | (2006.01) |
| *H01L 25/00* | (2006.01) |

(52) U.S. Cl.
CPC ...... *H01L 25/0657* (2013.01); *H01L 23/3128* (2013.01); *H01L 24/03* (2013.01); *H01L 24/09* (2013.01); *H01L 24/17* (2013.01); *H01L 25/50* (2013.01); *H01L 2224/0401* (2013.01); *H01L 2224/04042* (2013.01); *H01L 2225/0651* (2013.01); *H01L 2225/0652* (2013.01); *H01L 2225/06541* (2013.01); *H01L 2225/06568* (2013.01)

(58) Field of Classification Search
CPC . H01L 21/561; H01L 21/568; H01L 21/6835; H01L 23/3128; H01L 23/3135; H01L 23/552; H01L 23/5286; H01L 23/10; H01L 23/06
USPC ......................................................... 257/737
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |

(Continued)

*Primary Examiner* — Trung Q Dang
(74) *Attorney, Agent, or Firm* — JCIPRNET

(57) ABSTRACT

Package structures, PoP devices and methods of forming the same are disclosed. A package structure includes a first chip, a redistribution layer structure, a plurality of UBM pads, a plurality of connectors and a separator. The redistribution layer structure is electrically connected to the first chip. The UBM pads are electrically connected to the redistribution layer structure. The connectors are electrically connected to the UBM pads. The separator is over the redistribution layer structure and surrounds the connectors.

20 Claims, 31 Drawing Sheets

(56) References Cited

U.S. PATENT DOCUMENTS

| | | |
|---|---|---|
| 8,809,996 B2 | 8/2014 | Chen et al. |
| 8,829,676 B2 | 9/2014 | Yu et al. |
| 8,877,554 B2 | 11/2014 | Tsai et al. |
| 2009/0243083 A1* | 10/2009 | Han .................. H01L 23/49822 257/698 |
| 2011/0291288 A1 | 12/2011 | Wu et al. |
| 2012/0086109 A1* | 4/2012 | Kim ...................... H01L 21/561 257/659 |
| 2012/0228749 A1* | 9/2012 | Pagaila ................. H01L 23/147 257/659 |
| 2012/0280374 A1* | 11/2012 | Choi ....................... H01L 21/50 257/659 |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2016/0073496 A1* | 3/2016 | Vincent ................ H05K 1/0298 361/772 |
| 2016/0336249 A1* | 11/2016 | Kang .................. H01L 23/3128 |
| 2017/0005042 A1* | 1/2017 | Chen .................... H01L 23/552 |

\* cited by examiner

PACKAGE STRUCTURES, POP DEVICES AND METHODS OF FORMING THE SAME

CROSS-REFERENCE TO RELATED APPLICATION

This application claims the priority benefits of U.S. provisional application Ser. No. 62/343,018, filed on May 30, 2016. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

DETAILED DESCRIPTION

Figure 1A:
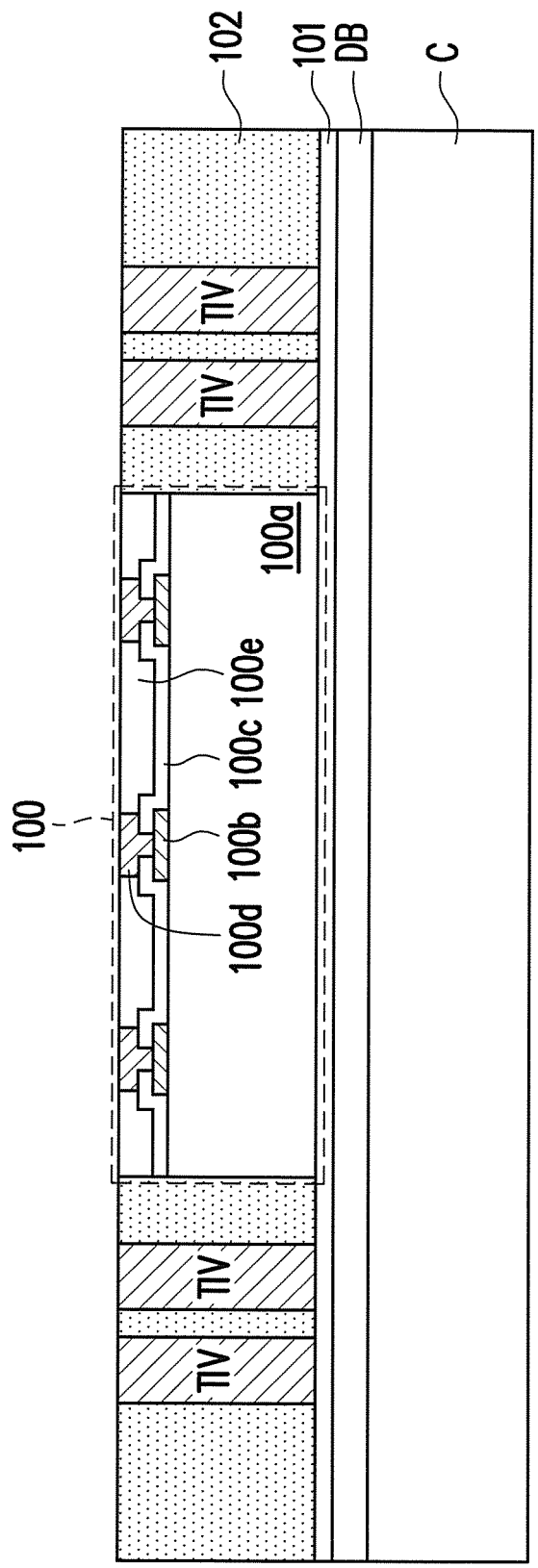
FIG. 1A to FIG. 1F are cross-sectional views of a method of forming a PoP device in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1F are cross-sectional views of a method of forming a PoP device in accordance with some embodiments.

Referring to FIG. 1A, a carrier C is provided with a chip 100 and a plurality of through integrated fan-out (InFO) vias TIV aside the chip 100. In some embodiments, the through integrated fan-out vias TIV are called through package vias (TPV) or through interface vias. In some embodiments, the carrier C has a de-bonding layer DB and a dielectric layer 101 formed thereon, and the de-bonding layer DB is between the carrier C and the dielectric layer 101. In some embodiments, the carrier C is a glass substrate, the de-bonding layer DB is a light-to-heat conversion (LTHC) release layer formed on the glass substrate, and the dielectric layer 101 is a polymer layer formed on the de-bonding layer. For example, the dielectric layer 101 includes polybenzoxazole (PBO), polyimide (PI), a suitable organic or inorganic material or the like. In some embodiments, the chip 100 has a substrate 100a, pads 100b over the substrate 100a, a passivation layer 100c over the substrate 100a and exposing portions of the pads 100b, connectors 100d over the passivation layer 100c and electrically connected to the pads 100b, and a protection layer 100e over the passivation layer 100c and aside the connectors 100d. In some embodiments, the connectors 100d include solder bumps, gold bumps, copper posts or the like, and are formed by an electroplating process. In some embodiments, the protection layer 100e includes polybenzoxazole (PBO), polyimide (PI), a suitable organic or inorganic material or the like. In some embodiments, the through integrated fan-out vias TIV include copper, nickel, solder, a combination thereof or the like, and are formed by an electroplating process. In some embodiments, the through integrated fan-out vias TIV are formed on the carrier C before the chip 100 is picked and placed on the carrier C. In alternative embodiments, the through integrated fan-out vias TIV are formed on the carrier C after the chip 100 is picked and placed on the carrier C.

Continue referring to FIG. 1A, an encapsulant 102 is formed over the carrier C to encapsulate the chip 100 and the through integrated fan-out vias TIV. In some embodiments, the encapsulant 102 surrounds the chip 100 and the through integrated fan-out vias TIV, and exposes the surfaces of the through integrated fan-out vias TIV and the connectors 100d. The encapsulant 102 includes a molding compound such as epoxy, a photo-sensitive material such as polybenzoxazole (PBO), polyimide (PI) or benzocyclobutene (BCB), a combination thereof or the like. The method of forming the encapsulant 102 includes forming an encapsulant material layer (not shown) on the carrier C covering the chip 100 and the through integrated fan-out vias TIV, and performing a grinding process to partially remove the encapsulant material layer until the surfaces of the through integrated fan-out vias TIV and the connectors 100d are exposed.

Figure 1B:
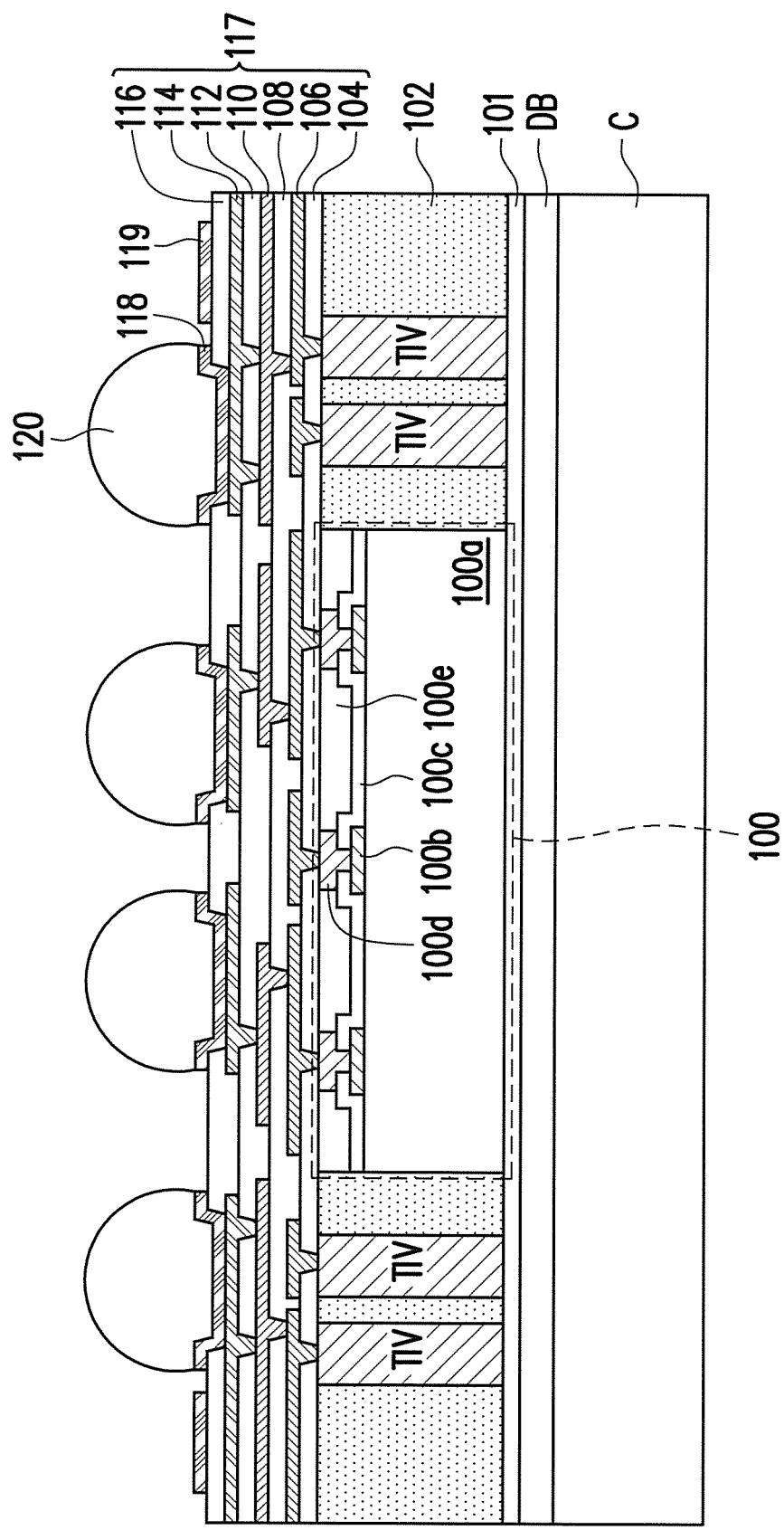

Referring to FIG. 1B, a redistribution layer structure 117 is formed over and electrically connected to the chip 100. In some embodiments, the redistribution layer structure 117 includes a plurality of polymer layers 104, 108, 112 and 116 and a plurality of redistribution layers 106, 110 and 114 stacked alternately. Specifically, the redistribution layer 106 is electrically connected to the connectors 100d and the through integrated fan-out vias TIV and penetrates through the polymer layer 104, the redistribution layer 110 is electrically connected to the redistribution layer 106 and penetrates through the polymer layer 108, the redistribution layer 114 is electrically connected to the redistribution layer 110 and penetrates through the polymer layer 112, and the polymer layer 116 covers the redistribution layer 114. In some embodiments, each of the polymer layers 104, 108, 112 and 116 includes a photo-sensitive material such as polybenzoxazole (PBO), polyimide (PI), benzocyclobutene (BCB), a combination thereof or the like. In some embodiments, each of the redistribution layers 106, 110 and 114 includes copper, nickel, titanium, a combination thereof or the like, and is formed by an electroplating process. The number of the polymer layers or the redistribution layers is not limited by the disclosure.

Continue referring to FIG. 1B, a plurality of under-ball metallurgy (UBM) pads 118 and a separator 119 aside the UBM pads 118 are formed. The UBM pads 118 are configured for ball mount. The separator 119 is configured to separate a structure from the tray which holds the structure during the electromagnetic interference (EMI) forming step, which will be described in details below. In some embodiments, the UBM pads 118 and the separator 119 are made by the same material, provided with substantially equal thickness, and formed simultaneously in the same process step. Specifically, each of the UBM pads 118 and the separator 119 includes copper, nickel, titanium, a combination thereof or the like, and is formed by an electroplating process. In some embodiments, the UBM pads 118 and the separator 119 are defined by the same photolithography reticle or photomask. That is, an additional photolithography reticle for defining the separator 119 is not required.

Figure 2:
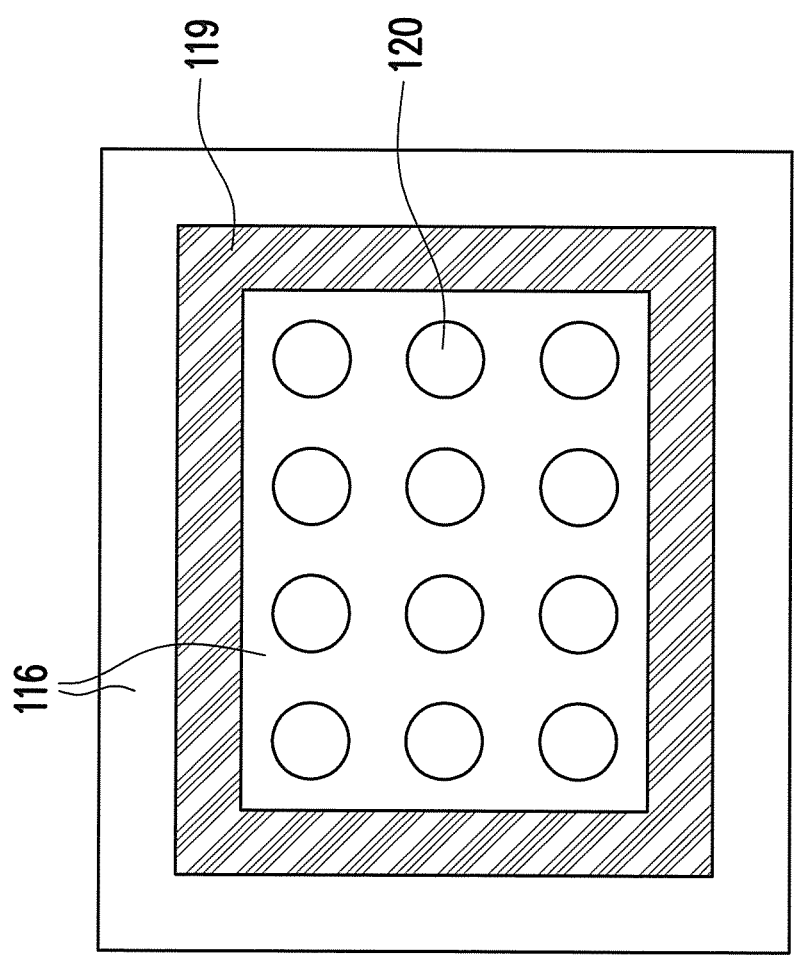
FIG. 2 is a simplified top view of FIG. 1B.

Thereafter, bumps, balls or connectors 120 are formed over and electrically connected to the UBM pads 118. In some embodiments, the connectors 120 are made of a conductive material with low resistivity, such as Sn, Pb, Ag, Cu, Ni, Bi or an alloy thereof, and are formed by a suitable process such as evaporation, plating, ball drop, or screen printing. In some embodiments, the separator 119 has a ring shape and surrounds the outmost UBM pads 118 or the connectors 120, as shown in the top view of FIG. 2. In some embodiments, the separator 119 is at a floating potential and electrically insulated from the redistribution layer structure 117 and the connectors 120.

Figure 1C:
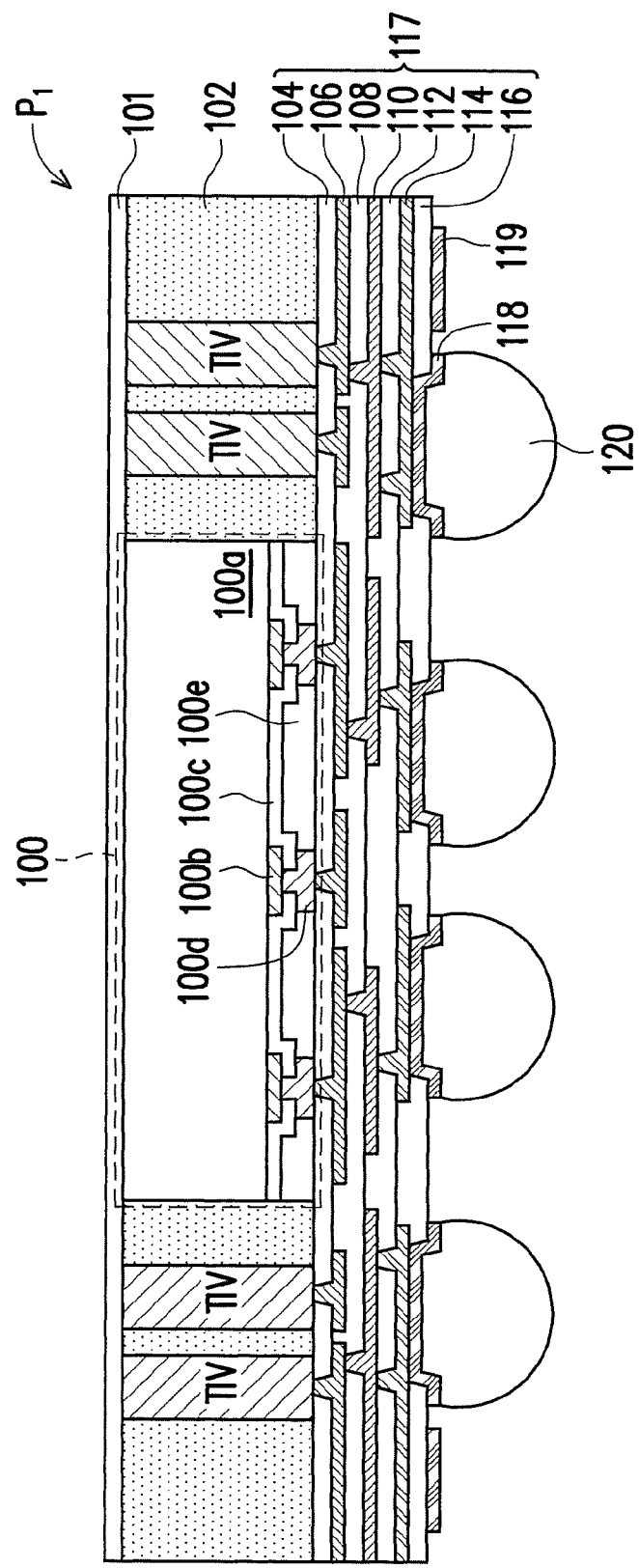
Figure 1D:
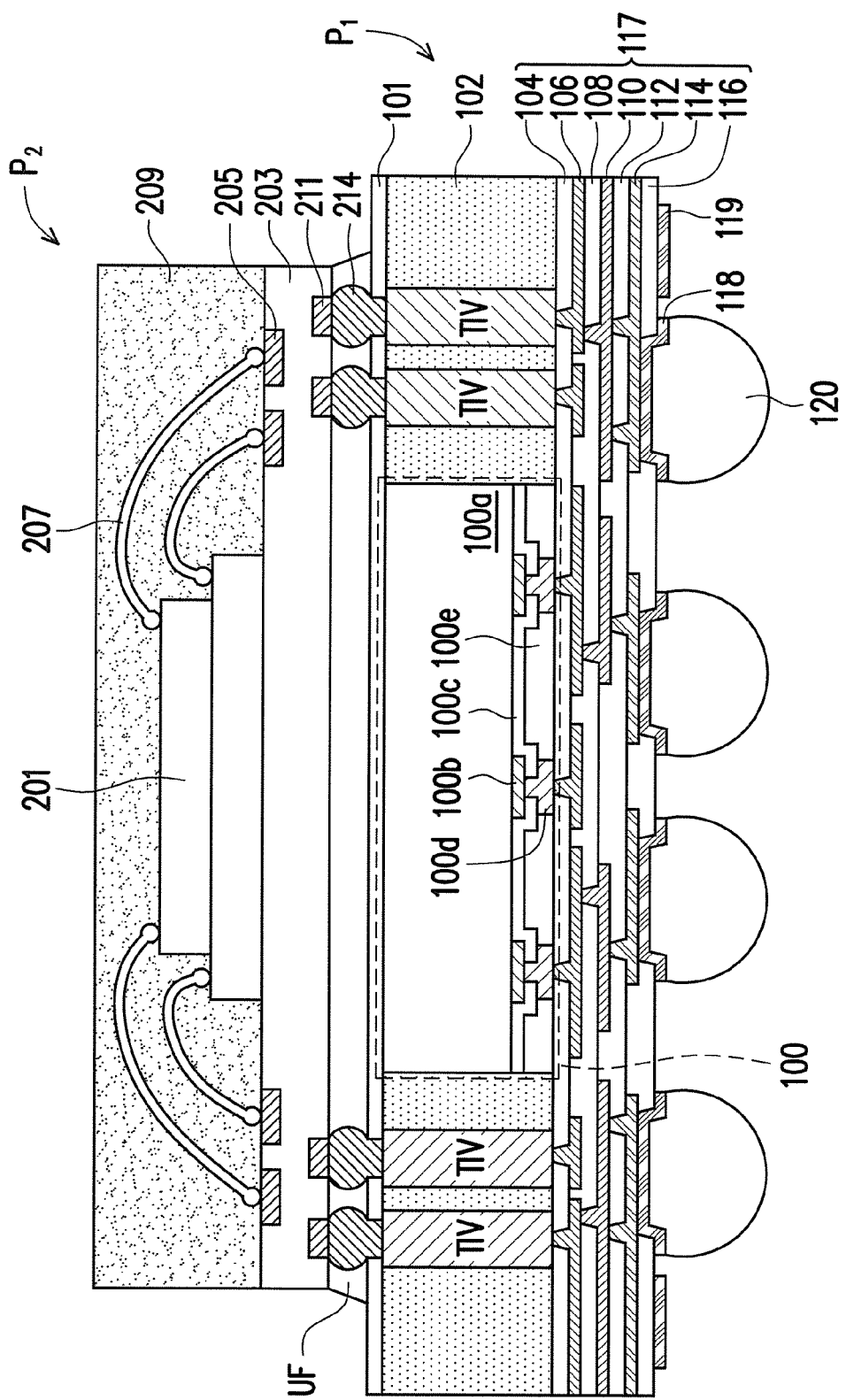

Referring to FIG. 1C and FIG. 1D, the carrier C is de-bonded from the backside of the package structure $P_1$, and another package structure $P_2$ is bonded to the same backside side of the package structure $P_1$.

As shown in FIG. 1C, the carrier C with the chip 100, the redistribution layer structure 117, the UBM pads 118, the separator 119 and the connectors 120 is turned over, the de-bonding layer DB is decomposed under heat of light, and the carrier C is then released from the package structure $P_1$ formed thereon.

As shown in FIG. 1D, another package structure $P_2$ is provided. In some embodiments, the package structure $P_2$ has a substrate 203, and a chip 201 is mounted on one surface (e.g. top surface) of the substrate 203. Bonding wires 207 are used to provide electrical connections between the chip 201 and a set of bonding pads 205 in the top surface portion of the substrate 203. An encapsulant 209 is formed over the components to protect the components from the environment and external contaminants. Through-vias or through InFO vias (not shown) may be used to provide electrical connections between the bonding pads 205 and another set of bonding pads 211 in the bottom surface portion of the substrate 203. Connectors 214 such as solder connectors are formed on the bottom surface of the substrate 203 to electrically connect to the bonding pads 211.

The package structure $P_2$ is then bonded to the package structure $P_1$ to form a bonded structure. In some embodiments, the connectors 214 of the package structure $P_2$ are aligned and inserted into the openings in the dielectric layer 101, and are electrically connect to the through integrated fan-out vias TIV of the package structure $P_1$.

Thereafter, an under-fill layer UF is formed to fill the space between the package structure $P_1$ and the package structure $P_2$ and to surround the connectors 214. In some embodiments, the underfill layer UF includes a molding compound such as epoxy, and is formed using dispensing, injecting, and/or spraying techniques.

Figure 1E:
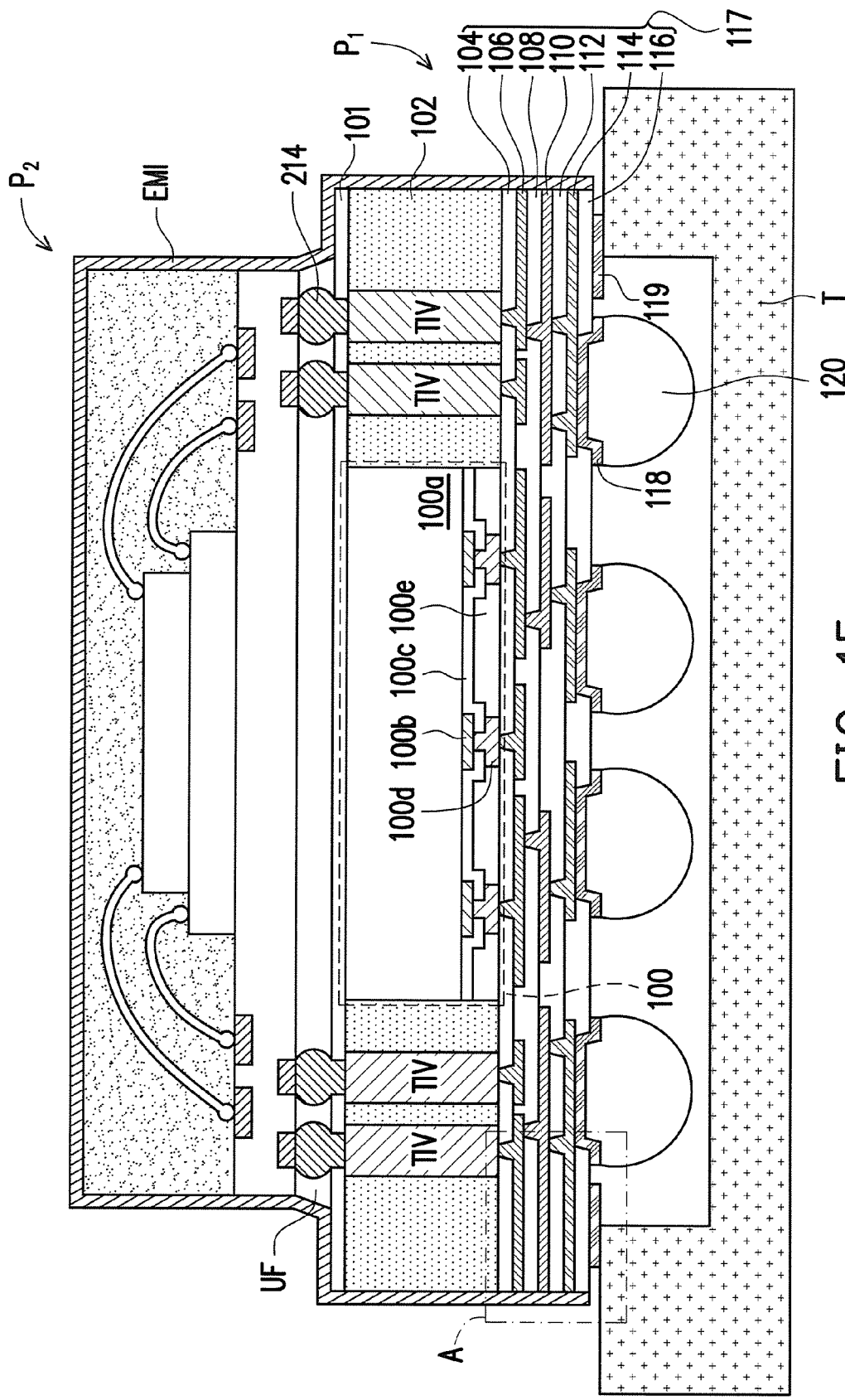

Referring to FIG. 1E, the bonded structure including the package structures $P_1$ and $P_2$ is placed on a tray T with the separator 119 against the surface of the tray T, and an electromagnetic interference layer EMI is formed to cover outer surfaces or exposed surfaces of the package structures $P_1$ and $P_2$. The electromagnetic interference layer EMI is configured to reduce or prevent the emission of electromagnetic waves and therefore mitigate noise and/or malfunction of the device. In some embodiments, the electromagnetic interference layer EMI is formed to cover the top and sidewall of the second package structure $P_2$ and is electrically connected to the redistribution layers 106, 110 and 114 of the redistribution layer structure 117 of the first package structure $P_1$. In some embodiments, the electromagnetic interference layer EMI includes aluminum, aluminum alloy, copper, copper alloy, titanium, titanium nitride, tantalum, tantalum nitride, tungsten, metal silicide, a combination thereof or the like, and is formed by a sputtering or a suitable technique. In some embodiments, the electromagnetic interference layer EMI is merely over the exposed tops and sidewalls of the package structures $P_1$ and $P_2$, without extending below the package structure $P_1$. In alternative embodiments, the electromagnetic interference layer EMI may further extend around the bottom corner of the package structure $P_1$ and along the surface of the polymer layer 116 with the thickness gradually reduced from the outside to the inside of the package structure $P_1$, and this thickness is relatively small. That is, the electromagnetic interference layer EMI has a few portion, if any, formed along the surface of the polymer layer 116, and such portion is too thin to be in contact with the tray T.

Figure 1F:
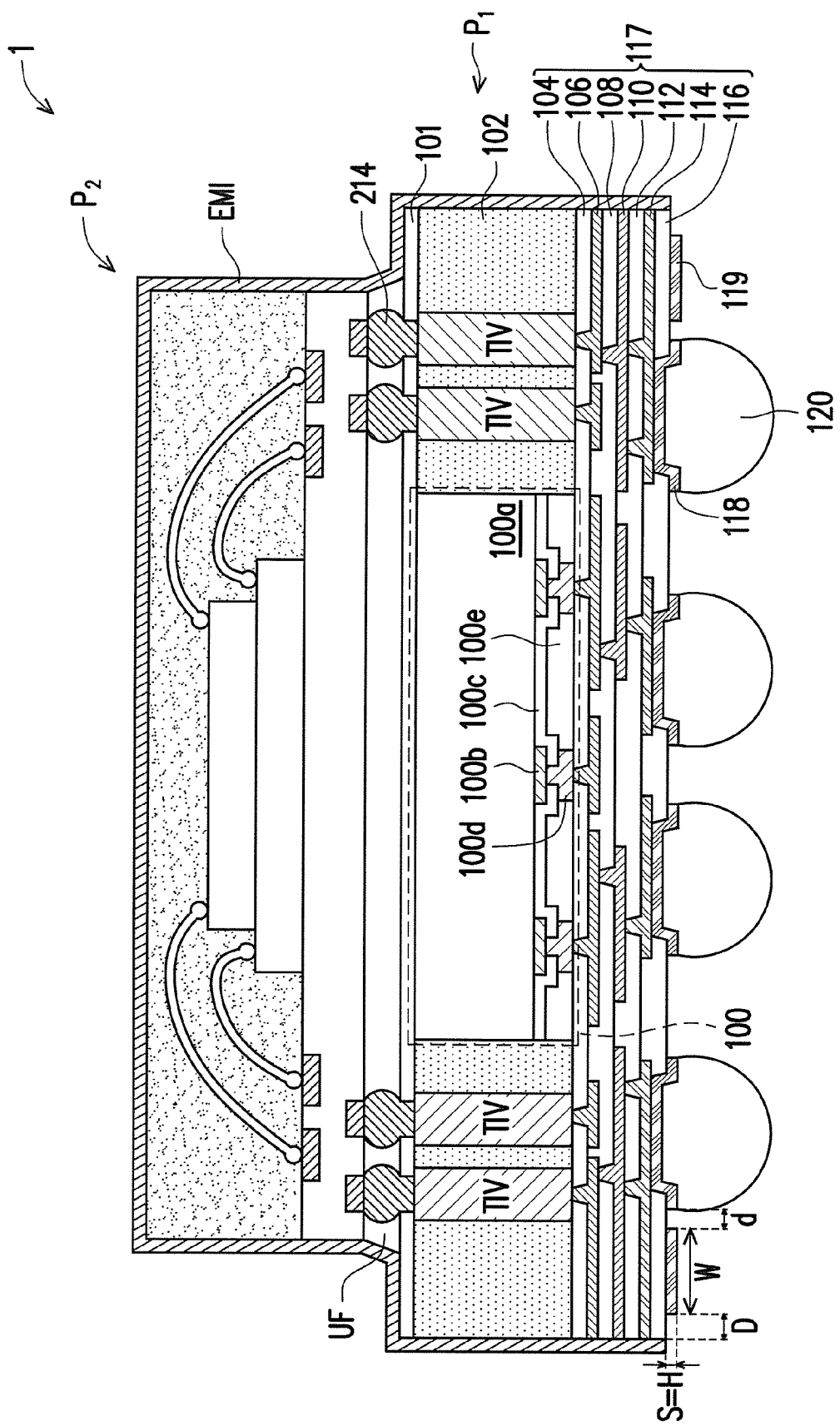

Referring to FIG. 1F, after the electromagnetic interference layer EMI is formed, the PoP device 1 of the disclosure is picked up from the tray T.

It is noted that the separator 119 of the disclosure plays a role of separating the bonded structure from the tray T when the electromagnetic interference layer EMI is formed. Such separation during the EMI forming step helps to prevent generation of the conventional EMI burr and therefore to improve the performance of the device.

Specifically, during the conventional EMI forming step, the bonded structure is placed on the EMI tray without a separator therebetween, so the formed EMI layer is sputtered along the outer surface of the bonded structure and on the surface of the tray continuously. In such case, when this bonded structure is picked up from the EMI tray, the conventional EMI burr is observed. Besides, in order to prevent the formed EMI layer from contacting the outmost connectors of the lower package structure, the keep out zone (KOZ) from the edge of the lower package structure to the outmost connectors of the same is usually greater than about 300 μm.

However, by disposing the separator 119 of the disclosure between the tray T and the lower package structure $P_1$ (as shown in FIG. 1E and FIG. 1F), the conventional EMI burr is not observed, and the KOZ for the EMI shielding can be significantly reduced to 100 μm or even less.

Figure 3:
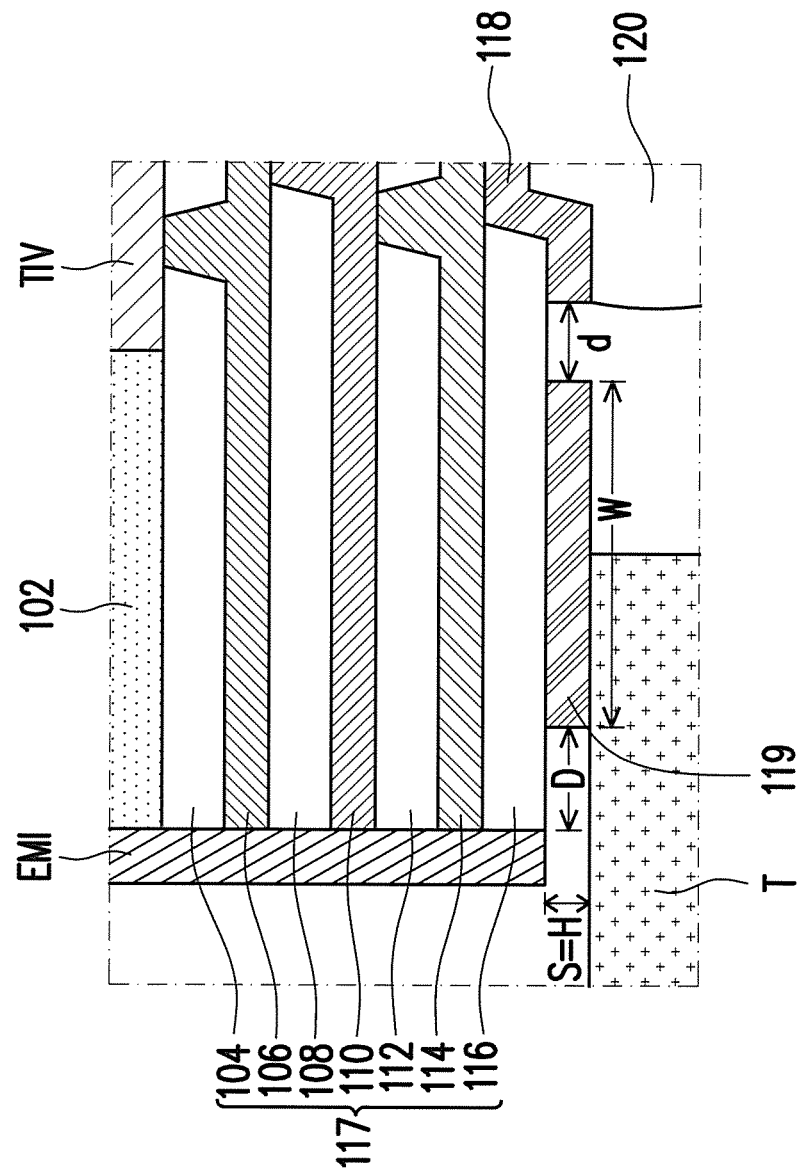
FIG. 3 is an enlarged view illustrating the region A of FIG. 1E.

As shown in the enlarged view of the region A in FIG. 3, a distance from an outermost UBM pad 118 to an inner border of the separator 119 is "d", a width of the separator 119 is "W", a height of the separator 119 is "H", and a distance from an edge of the package structure $P_1$ to an outer border of the separator 119 is "D". The ratios between the above parameters "d", "W", "D" and "H" are required to fall within the specific ranges so as to achieve the mentioned effects.

Besides, a separation distance between the package structure $P_1$ and the tray T is "S". In some embodiments, the separation distance ("S") is the vertical distance from the exposed surface of the separator 119 to the exposed surface of the redistribution layer structure 117. The electromagnetic interference layer EMI has less chance to contact the tray T when the separation distance ("S") between the package structure $P_1$ and the tray T is increased. In some embodiments, the separation distance ("S") is equal to the height ("H") of the separator 119, as shown in FIG. 3.

In some embodiments, the ratio of d to W ranges from about 1:1 to 1:10. For example, the ratio of d to W can be about 1, 1/2, 1/3, 1/4, 1/5, 1/6, 1/7, 1/8, 1/9, 1/10, including any range between any two of the preceding values.

In some embodiments, the ratio of d to H ranges from about 1:1 to 1:10. For example, the ratio of d to H can be about 1, 1/2, 1/3, 1/4, 1/5, 1/6, 1/7, 1/8, 1/9, 1/10, including any range between any two of the preceding values.

Figure 5:
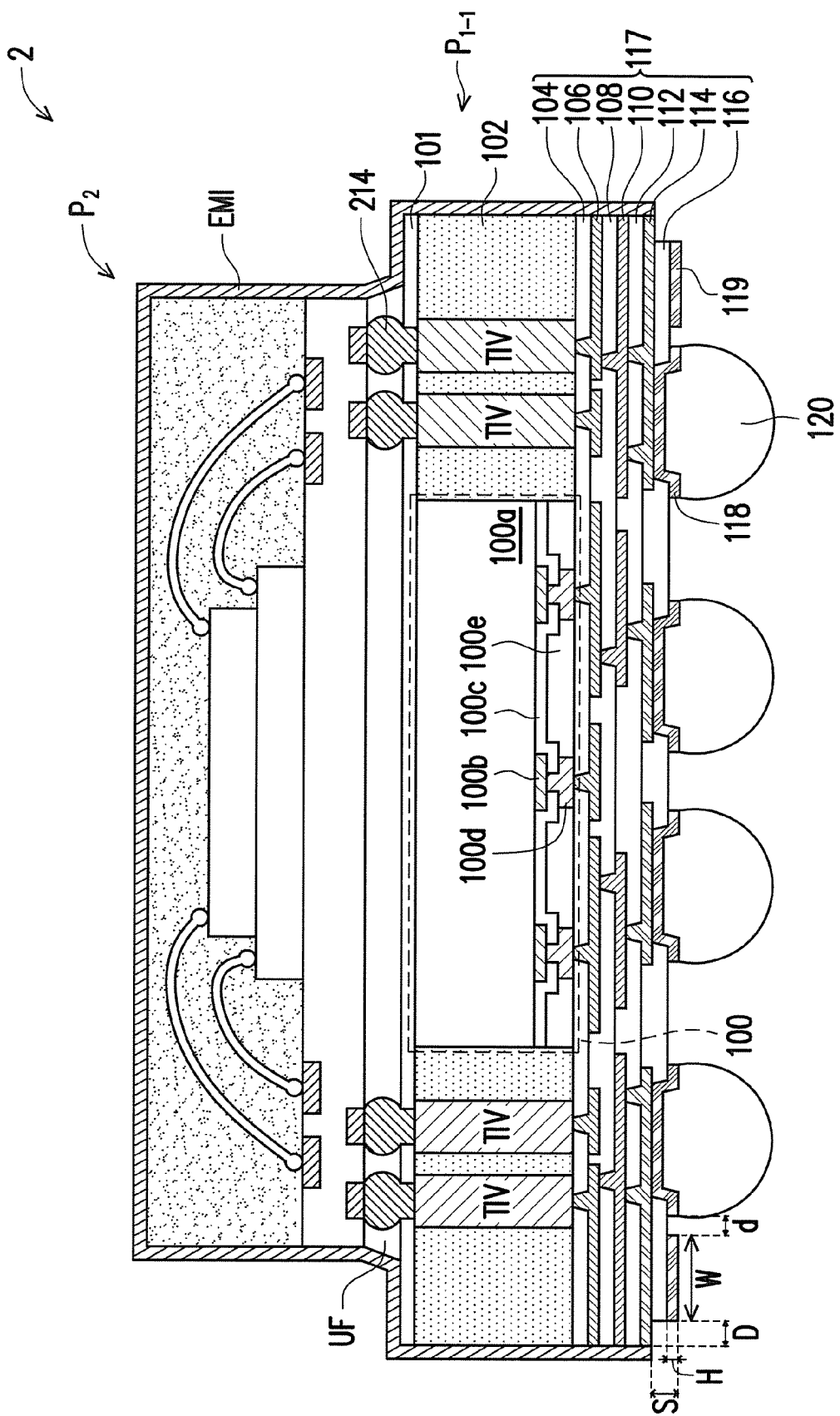
FIG. 5 to FIG. 7 are cross-sectional views of PoP devices in accordance with some embodiments.
Figure 6:
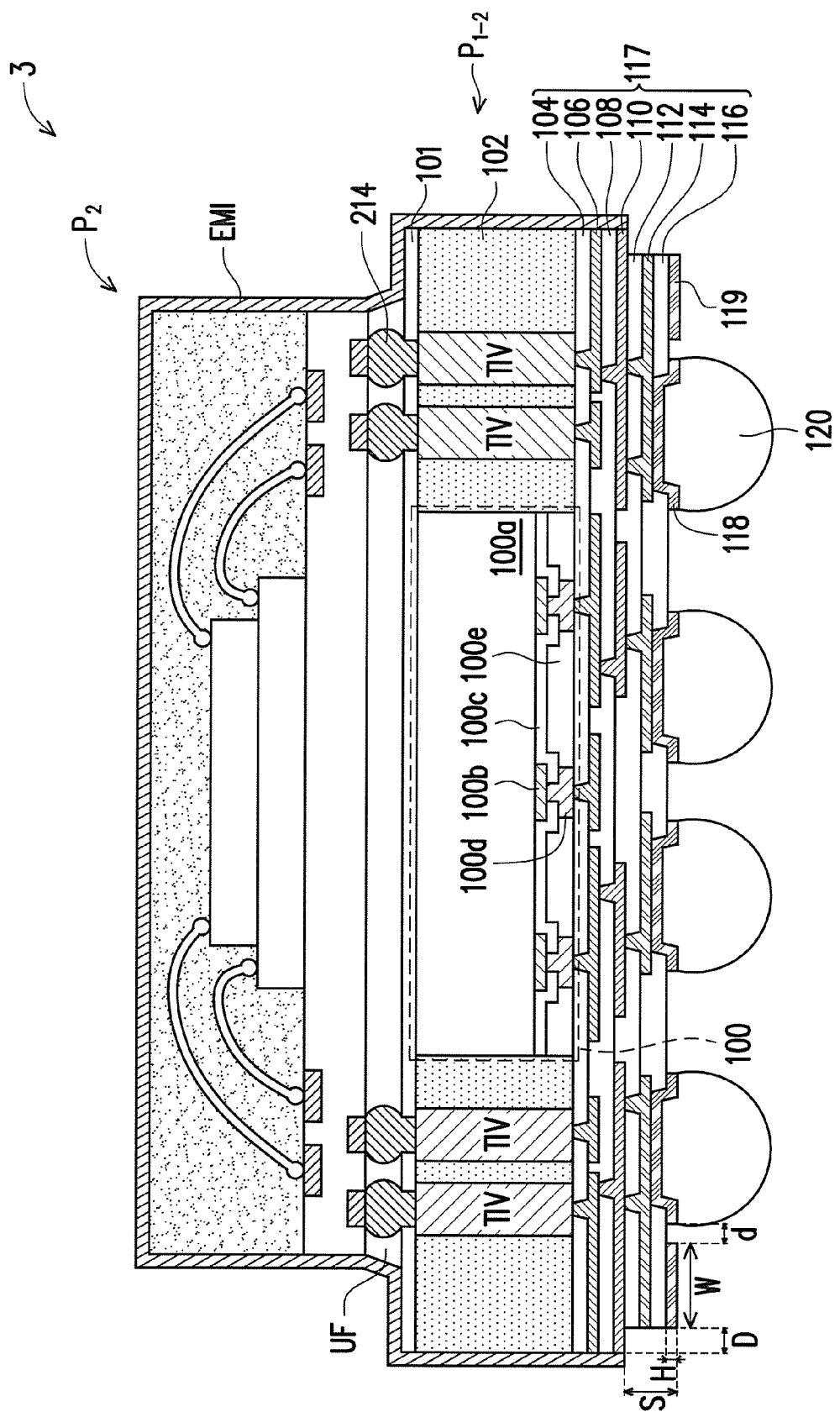
Figure 7:
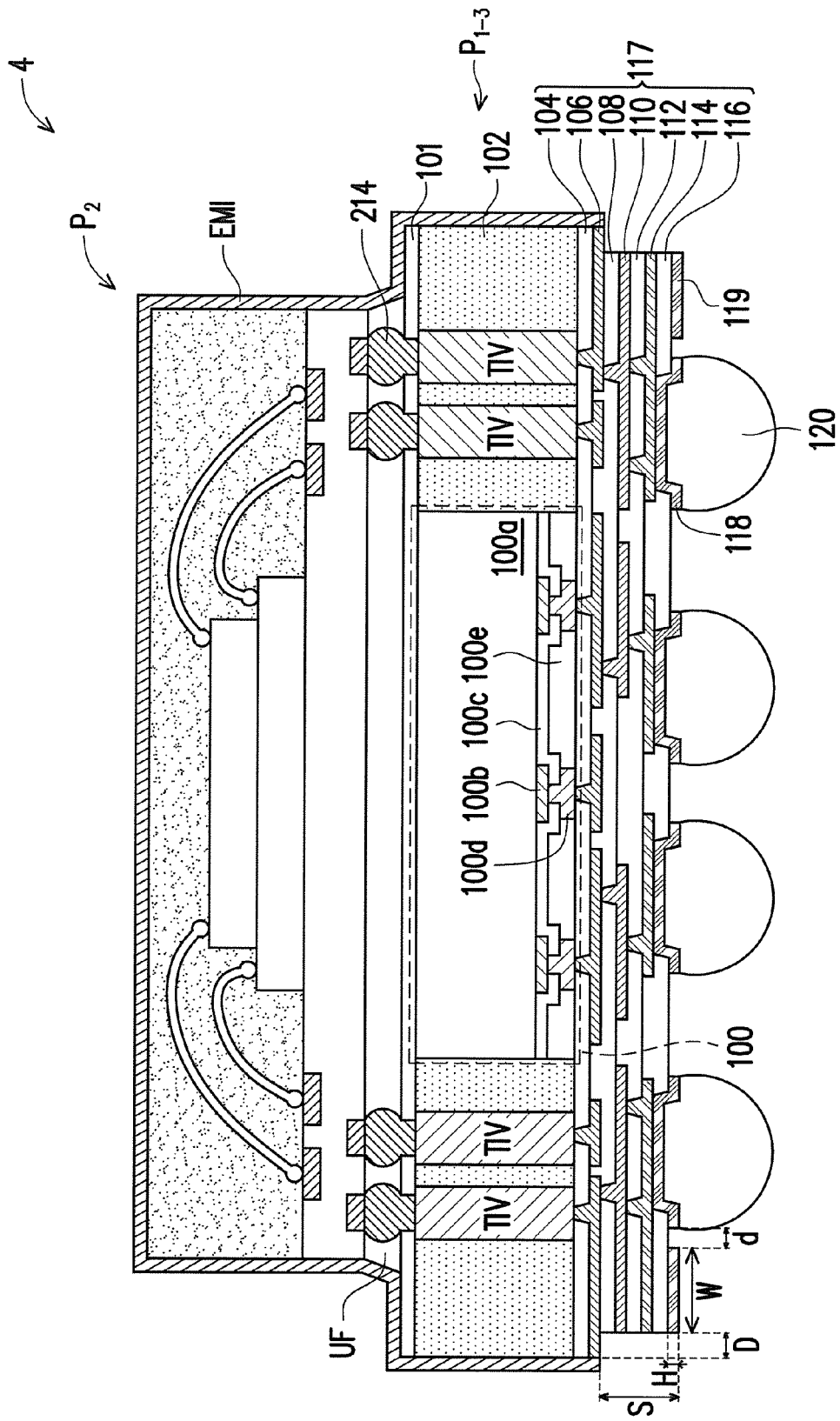

In some embodiments, the edge of the package structure $P_1$ has a substantially vertical profile, the outer border of the separator 119 is not aligned with the edge of the package structure $P_1$, and the ratio of d to D ranges from about 1:0.1 to 1:5. For example, the ratio of d to D can be about 10, 9, 8, 7, 6, 5, 4, 3, 2, 1, 1/2, 1/3, 1/4, 1/5, including any range between any two of the preceding values. However, the present disclosure is not limited thereto. In alternative embodiments, the edge of the package structure $P_{1\text{-}1}/P_{1\text{-}2}/P_{1\text{-}3}$ has a stepped profile such as a single-step profile, and the outer border of the separator 119 is aligned with the adjacent edge of the package structure $P_{1\text{-}1}/P_{1\text{-}2}/P_{1\text{-}3}$, as shown in FIGS. 5-7. That is, the distance ("D") from the adjacent edge of the package structure $P_{1\text{-}1}/P_{1\text{-}2}/P_{1\text{-}3}$ to the outer border of the separator 119 is about zero. In yet alternative embodiments, the edge of the package structure has a stepped profile such as a multi-step profile, and the outer border of the separator 119 is aligned with the adjacent portion of the stepped edge of the package structure.

In some embodiments, the step of FIG. 1B is modified so that the formed polymer layer 116 exposes the edge portion of the redistribution layer 114, and the steps similar to the steps described in FIG. 1C to FIG. 1F are then implemented. As shown in FIG. 5, a PoP device 2 including the package structures $P_{1\text{-}1}$ and $P_2$ is therefore provided, in which the outer border of the separator 119 is aligned with the edge of the polymer layer 116 of the redistribution layer structure 117 of the package structure $P_{1\text{-}1}$, and the electromagnetic interference layer EMI is electrically connected to the redistribution layers 106, 110 and 114 of the redistribution layer structure 117. As shown in FIG. 5, the separation distance ("S") is the vertical distance from the exposed surface of the separator 119 to the exposed surface of redistribution layer 114 of the redistribution layer structure 117, and the separation distance ("S") is greater than the height ("H") of the separator 119.

In some embodiments, the step of FIG. 1B is modified so that the formed polymer layer 116, the redistribution layer 114 and the polymer layer 112 all expose the edge portion of the redistribution layer 110, and the steps similar to the steps described in FIG. 1C to FIG. 1F are then implemented. As shown in FIG. 6, a PoP device 3 including the package structures $P_{1\text{-}2}$ and $P_2$ is therefore provided, in which the outer border of the separator 119 is aligned with the edges of the polymer layer 116, the redistribution layer 114 and the polymer layer 112 of the redistribution layer structure 117 of the package structure $P_{1\text{-}2}$, and the electromagnetic interference layer EMI is electrically connected to the redistribution layers 106 and 110 of the redistribution layer structure 117. As shown in FIG. 6, the separation distance ("S") is the vertical distance from the exposed surface of the separator 119 to the exposed surface of redistribution layer 110 of the redistribution layer structure 117, and the separation distance ("S") is greater than the height ("H") of the separator 119.

In some embodiments, the step of FIG. 1B is modified so that the formed polymer layer 116, the redistribution layer 114, the polymer layer 112, the redistribution layer 110 and the polymer layer 108 all exposes the edge portion of the redistribution layer 106, and the steps similar to the steps described in FIG. 1C to FIG. 1F are then implemented. As shown in FIG. 7, a PoP device 4 including the package structures $P_{1\text{-}3}$ and $P_2$ is therefore provided, in which the outer border of the separator 119 is aligned with the edges of the polymer layer 116, the redistribution layer 114, the polymer layer 112, the redistribution layer 110 and the polymer layer 108 of the redistribution layer structure 117 of the package structure $P_{1\text{-}3}$, and the electromagnetic interference layer EMI is electrically connected to the redistribution layer 106 of the redistribution layer structure 117. As shown in FIG. 7, the separation distance ("S") is the vertical distance from the exposed surface of the separator 119 to the exposed surface of redistribution layer 106 of the redistribution layer structure 117, and the separation distance ("S") is greater than the height ("H") of the separator 119.

Figure 4:
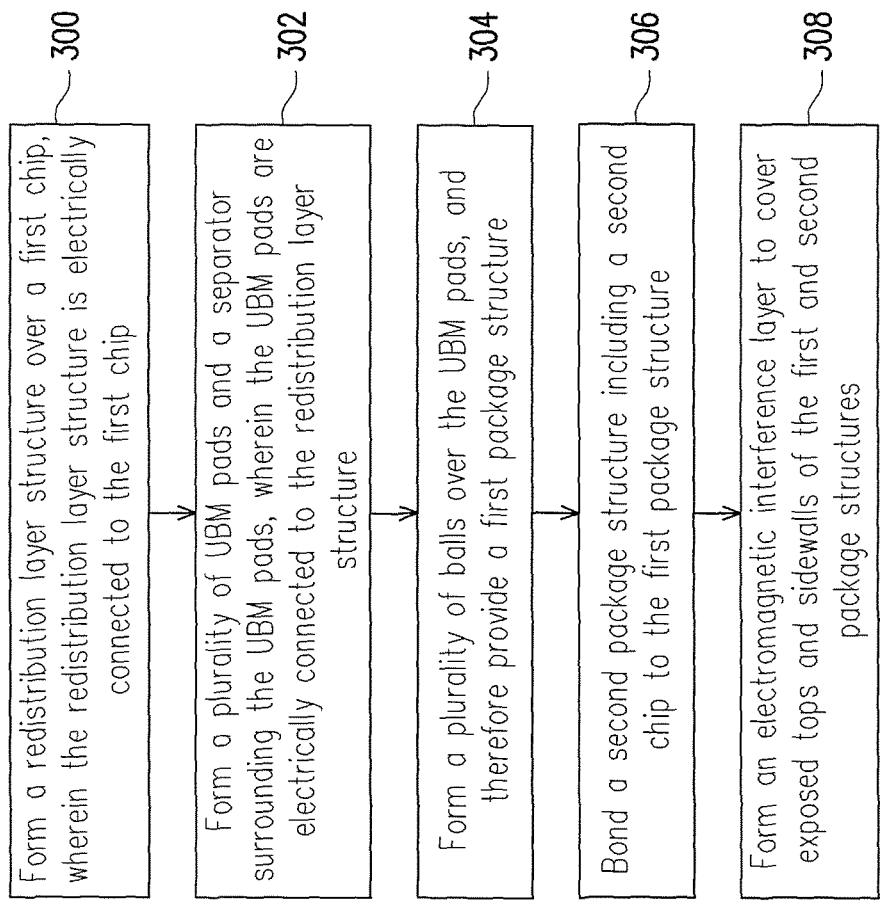
FIG. 4 is a flow chart illustrating a method of forming a PoP device in accordance with some embodiments.

The said process steps of FIG. 1A to FIG. 1F can be concisely illustrated with reference to the flow chart of FIG. 4.

At step 300, a redistribution layer structure 117 is formed over a first chip (e.g., chip 100), wherein the redistribution layer structure 117 is electrically connected to the first chip, as shown in FIG. 1A, FIG. 1B and FIGS. 5-7. At step 302, a plurality of UBM pads 118 and a separator 119 surrounding the UBM pads 118 are formed, wherein the UBM pads 118 are electrically connected to the redistribution layer structure 117, as shown in FIG. 1B and FIGS. 5-7. At step 304, a plurality of connectors 120 is formed over the UBM pads 118, and a first package structure (e.g., package structure $P_1/P_{1-1}/P_{1-2}/P_{1-3}$) is therefore provided, as shown in FIG. 1B, FIG. 1C and FIGS. 5-7. At step 306, a second package structure (e.g., package structure $P_2$) including a second chip (e.g., chip 201) is bonded to the first package structure, as shown in FIG. 1D and FIGS. 5-7. At step 308, an electromagnetic interference layer EMI is formed to cover exposed tops and sidewalls of the first and second package structures, as shown in FIG. 1E, FIG. 1F and FIGS. 5-7. The PoP device 1/2/3/4 of the disclosure is thus completed.

The above embodiments in which the separator and the UBM pads are formed simultaneously in the same process step are provided for illustration purposes, and are not construed as limiting the present disclosure. In alternative embodiments, the separator and the UBM pads can be formed separately in different process steps. For example, the separator can be formed after or before the step of forming the UBM pads.

Figure 9:
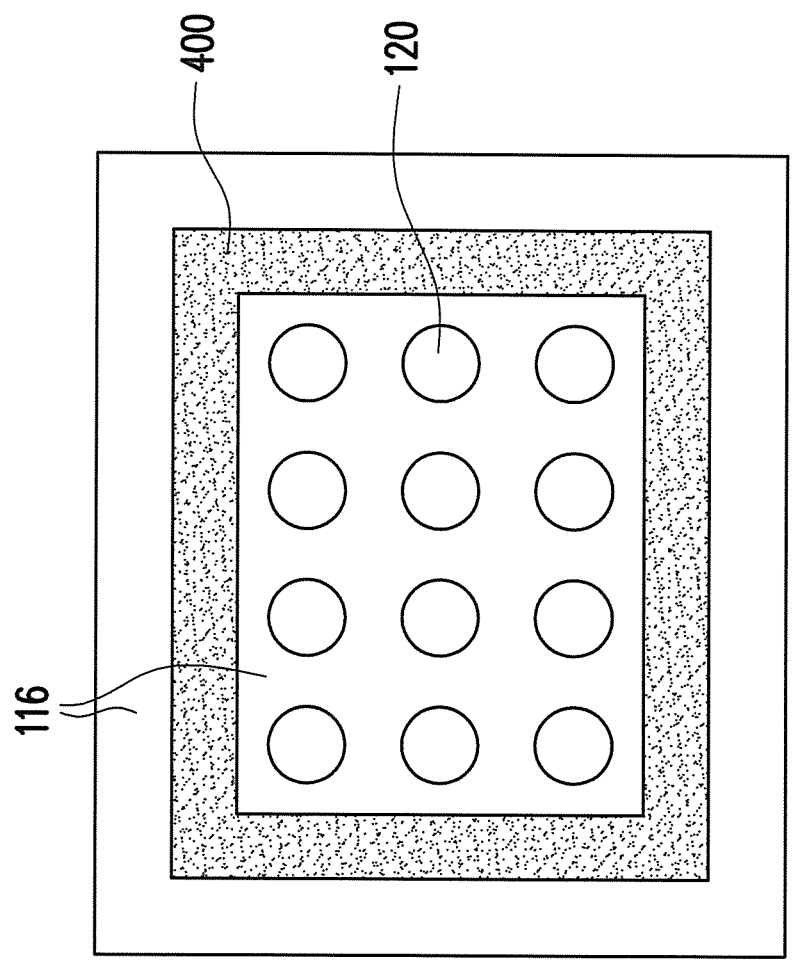
FIG. 9 is a simplified top view of FIG. 8B.
Figure 10:
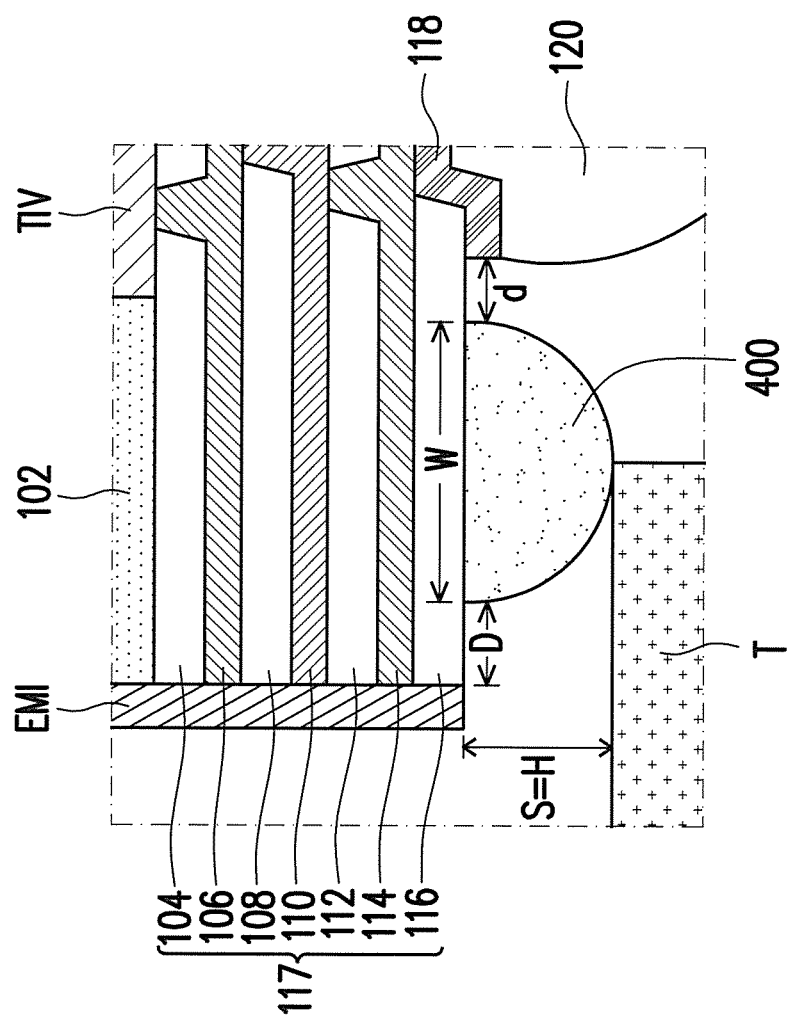
FIG. 10 is an enlarged view illustrating the region A of FIG. 8E.
Figure 11:
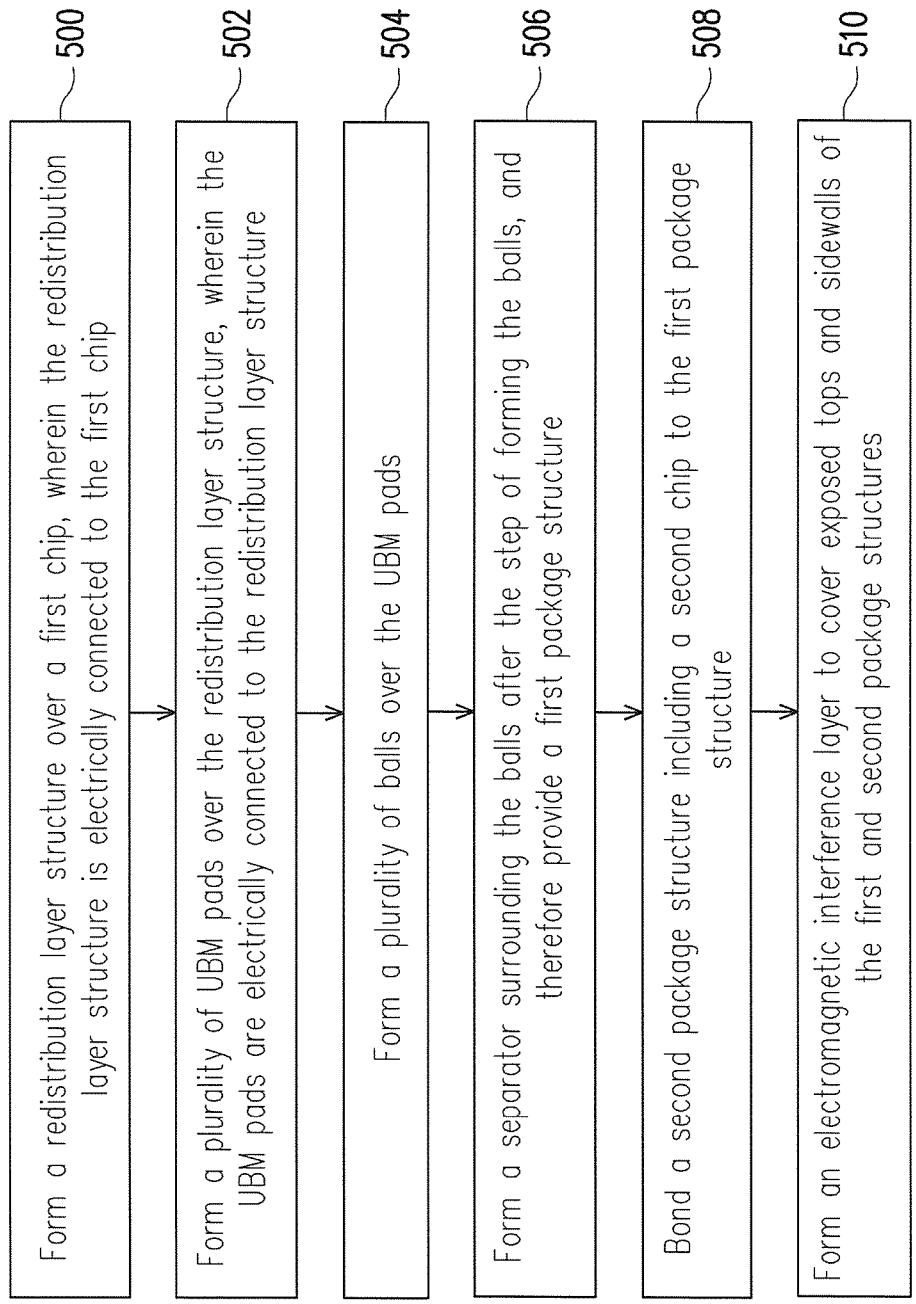
FIG. 11 is a flow chart illustrating a method of forming a PoP device in accordance with alternative embodiments.

FIG. 8A to FIG. 8F are cross-sectional views of a method of forming a PoP device in accordance with alternative embodiments. FIG. 9 is a simplified top view of FIG. 8B. FIG. 10 is an enlarged view illustrating the region A of FIG. 8E. FIG. 11 is a flow chart illustrating a method of forming a PoP device in accordance with alternative embodiments.

The difference between the method of FIG. 8A to FIG. 8F and the method of FIG. 1A to FIG. 1F lies in the separator forming method. The difference is illustrated in details below, and the similarity is not iterated herein.

Referring to FIG. 8A, FIG. 11 and FIGS. 12-15, at step 500, a redistribution layer structure 117 is formed over a first chip (e.g., chip 100), wherein the redistribution layer structure 117 is electrically connected to the first chip.

Figure 8A:
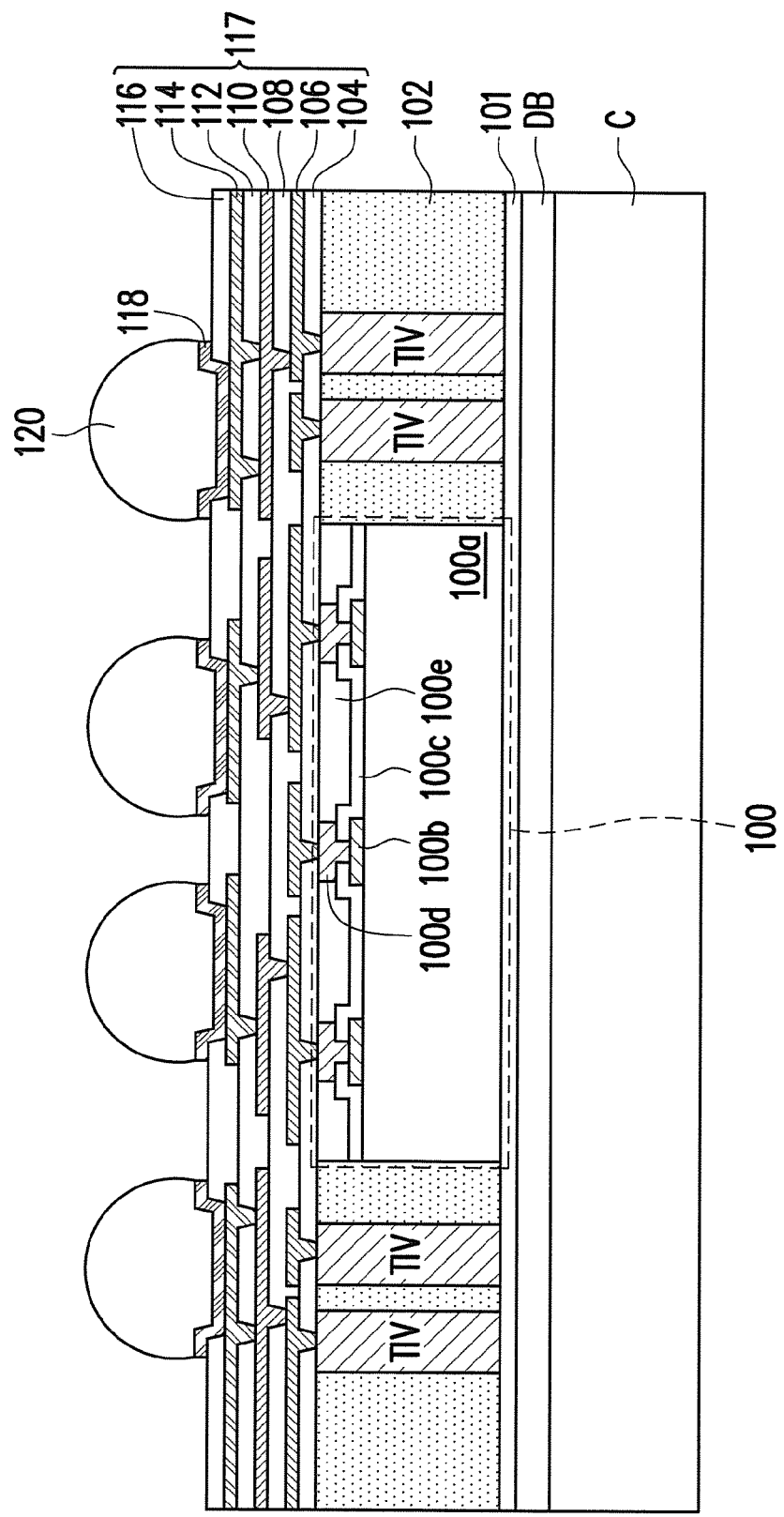
FIG. 8A to FIG. 8F are cross-sectional views of a method of forming a PoP device in accordance with alternative embodiments.
Figure 12:
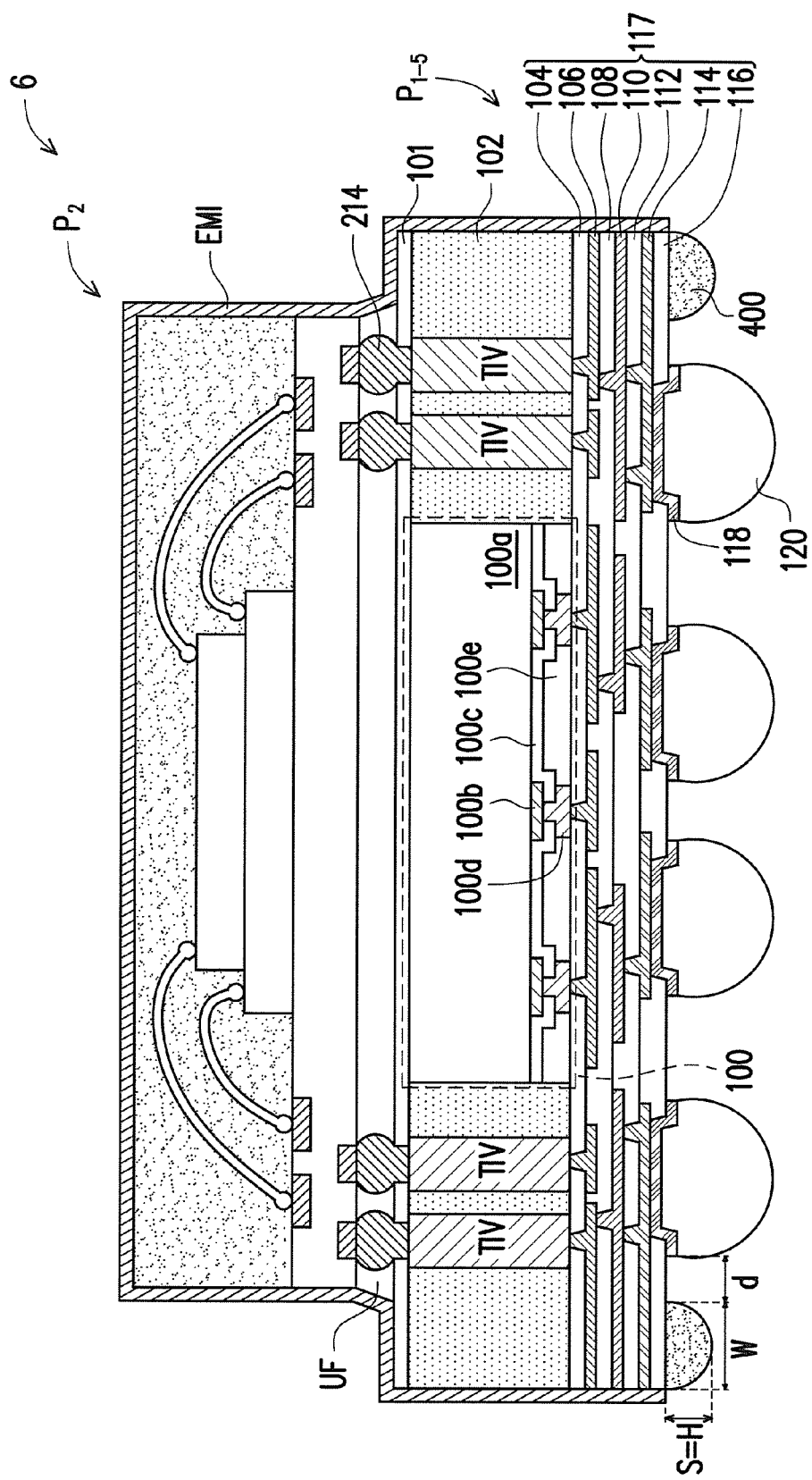
FIG. 12 to FIG. 15 are cross-sectional views of PoP devices in accordance with alternative embodiments.
Figure 13:
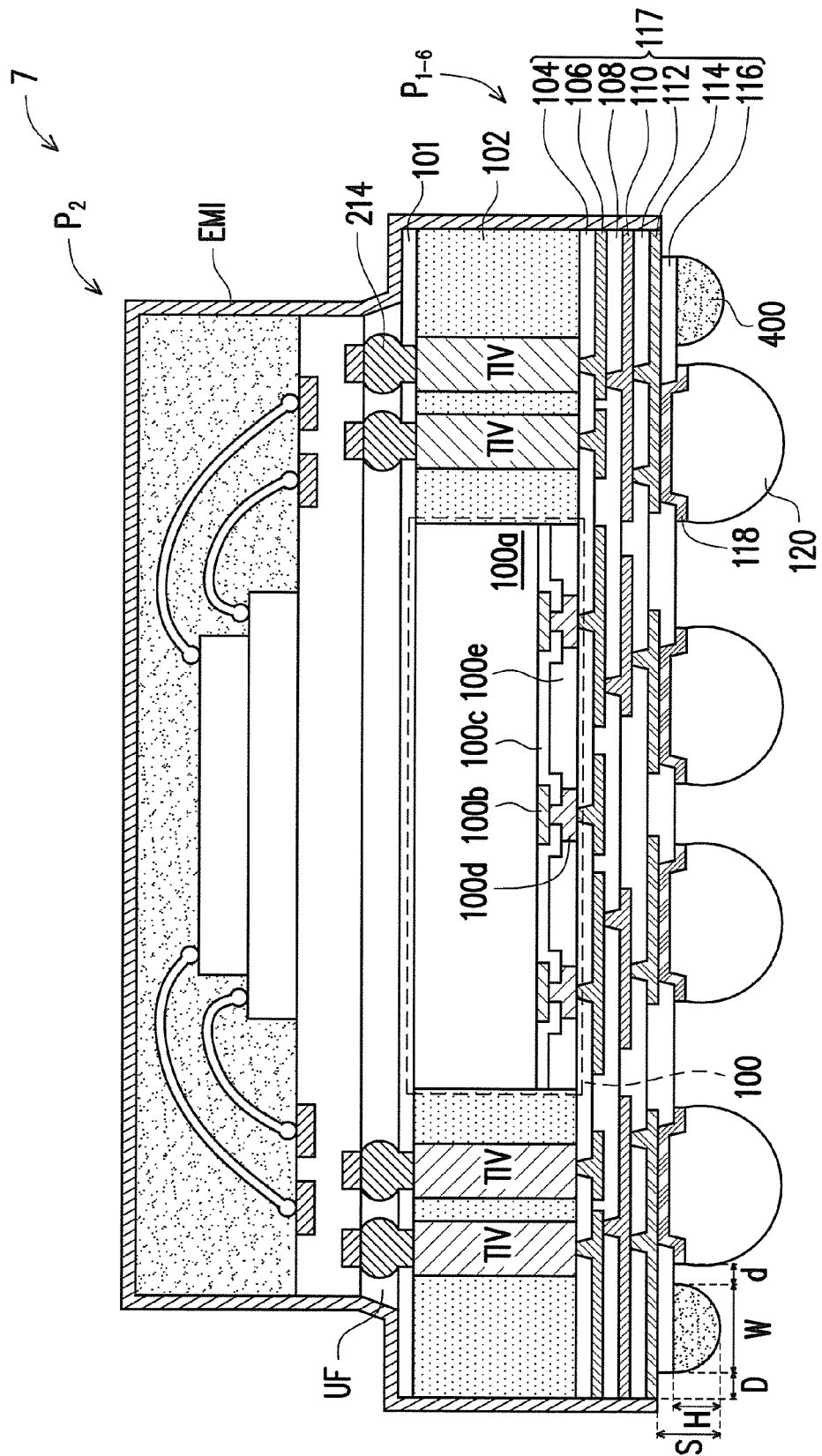
Figure 14:
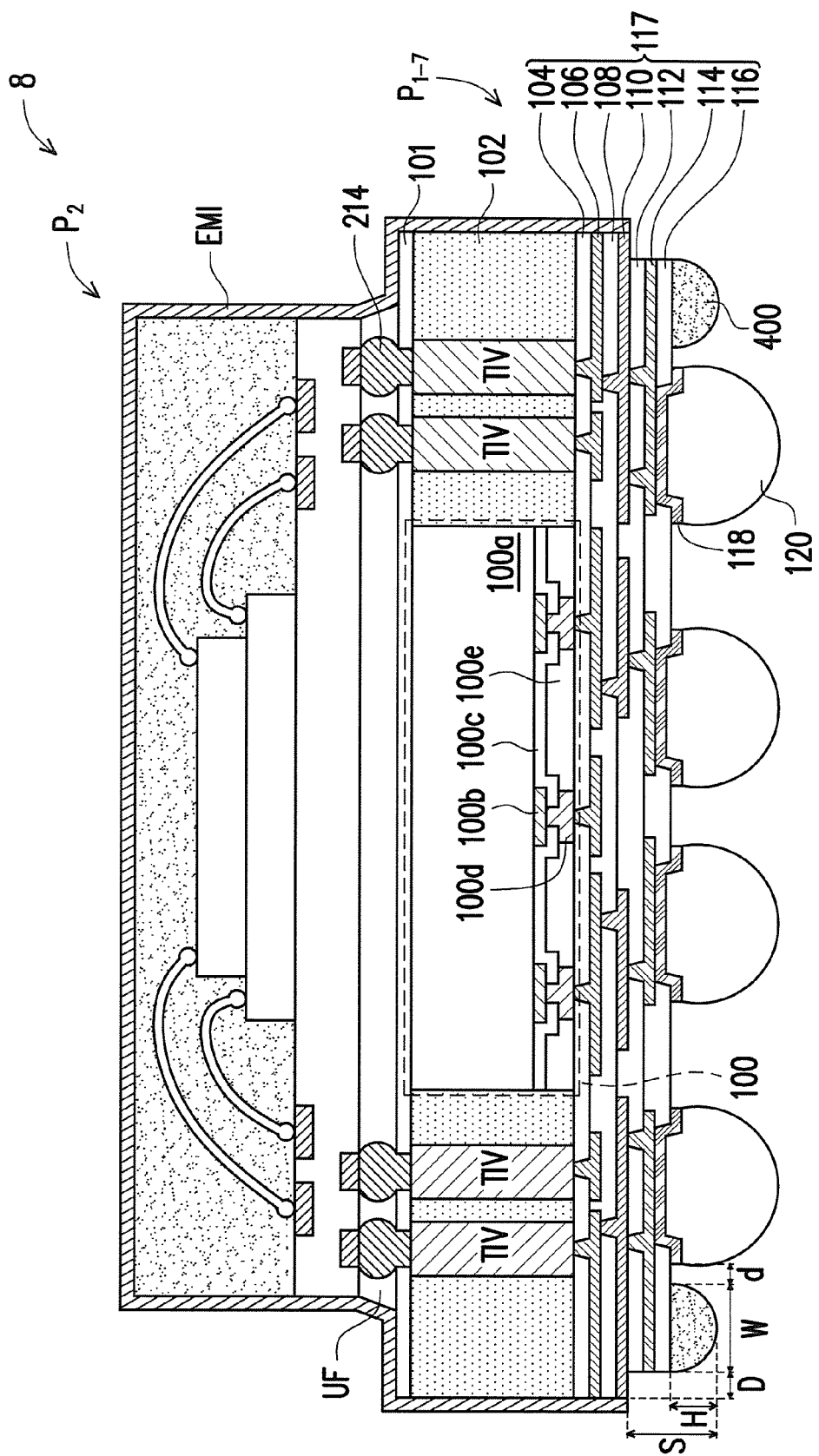
Figure 15:
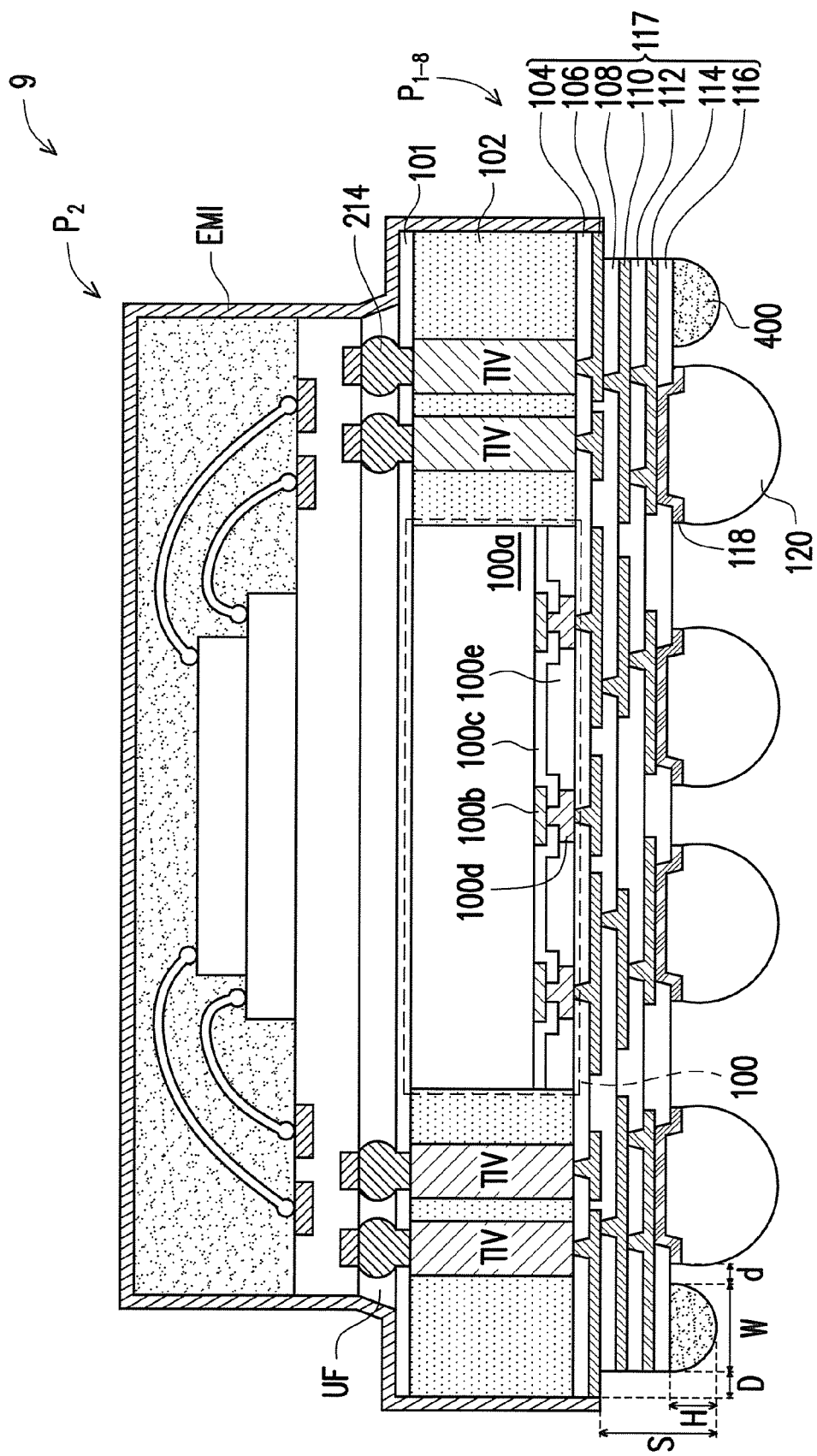

In some embodiments, the edge of the redistribution layer structure 117 has a substantially vertical profile, as shown in FIG. 8A and FIG. 12. In alternative embodiments, the step of forming the redistribution layer structure 117 can be modified as described above, so the edge of the redistribution layer structure 117 has a stepped profile, and the surface of the redistribution layer 114, 110 or 106 is exposed upon the process requirements, as shown in FIG. 13 to FIG. 15.

Thereafter, at step 502, a plurality of UBM pads 118 is formed over the redistribution layer structure 117, wherein the UBM pads 118 are electrically connected to the redistribution layer structure 117. Afterwards, at step 504, a plurality of connectors 120 is formed over the UBM pads 118.

Referring to FIG. 8B, FIG. 8C, FIG. 11 and FIGS. 12-15, at step 506, a separator 400 is formed to surround the connectors 120 after the step of forming the connectors 120, and a first package structure (e.g., package structure $P_{1-4}/P_{1-5}/P_{1-6}/P_{1-7}/P_{1-8}$) is therefore provided. As shown in the top view of FIG. 9, the separator 400 has a ring shape and surrounds the outmost UBM pads 118 or the connectors 120. In some embodiments, the separator 400 is a polymer dam including a molding compound such as epoxy, a photosensitive material such as polybenzoxazole (PBO), polyimide (PI) or benzocyclobutene (BCB), a combination thereof or the like. The separator 400 is formed using dispensing, injecting, and/or spraying techniques. In some embodiments, the separator 400 has a dome shape or a hemispherical shape.

Figure 8B:
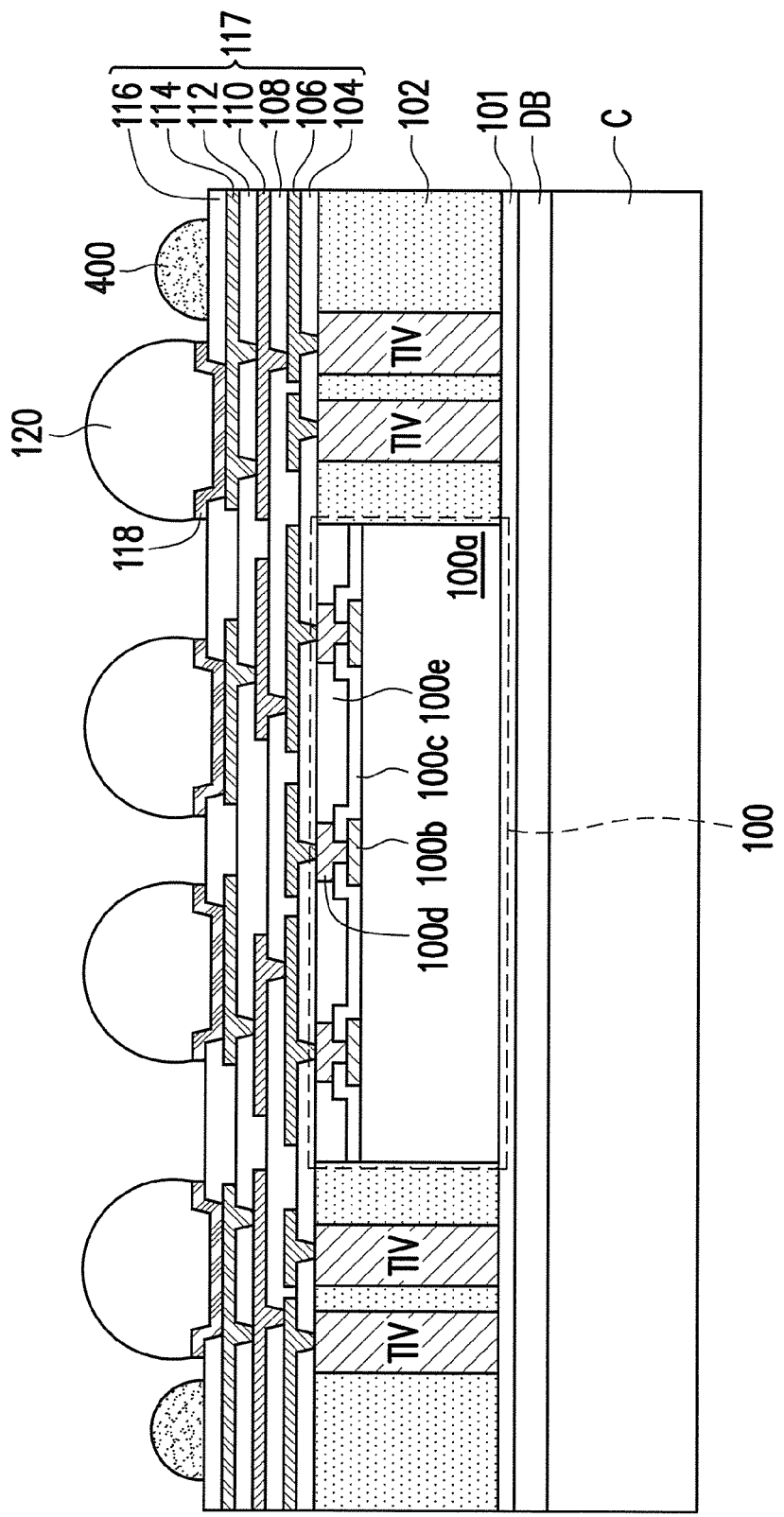
Figure 8C:
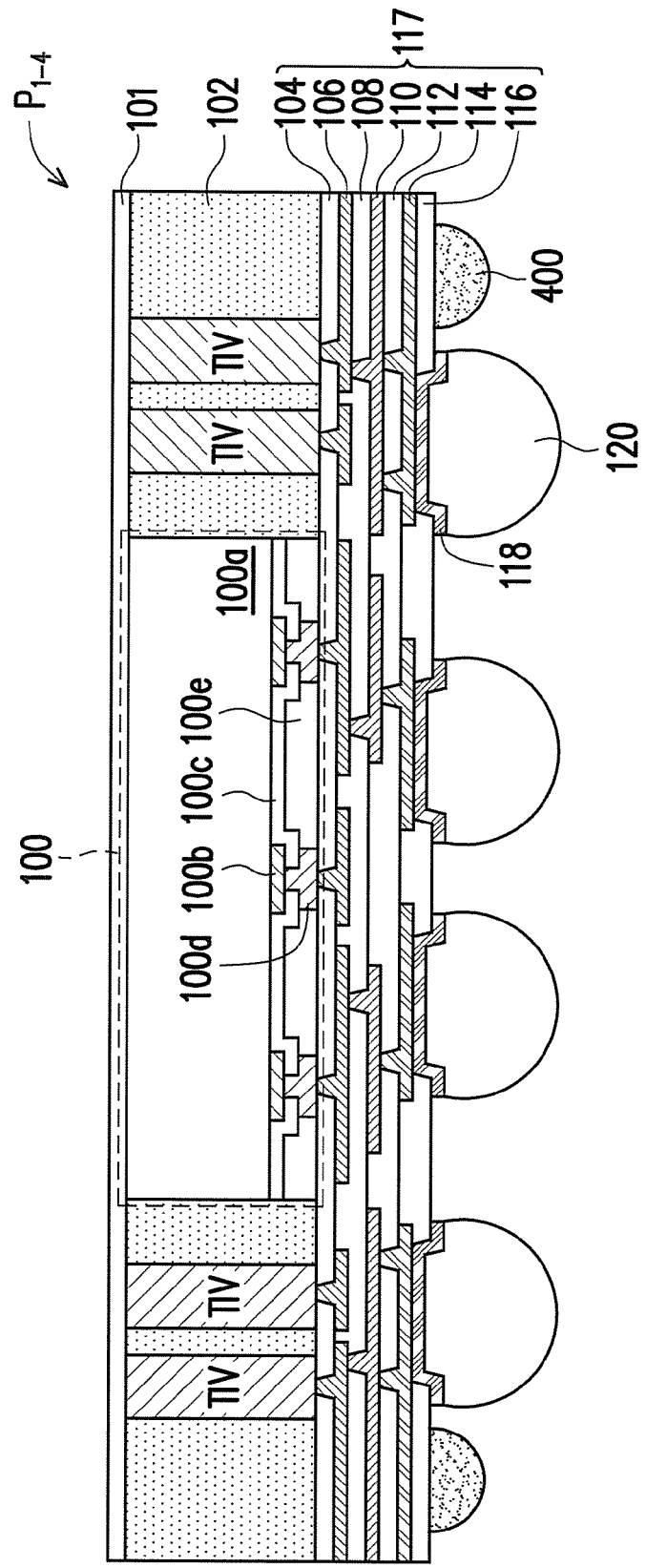
Figure 8D:
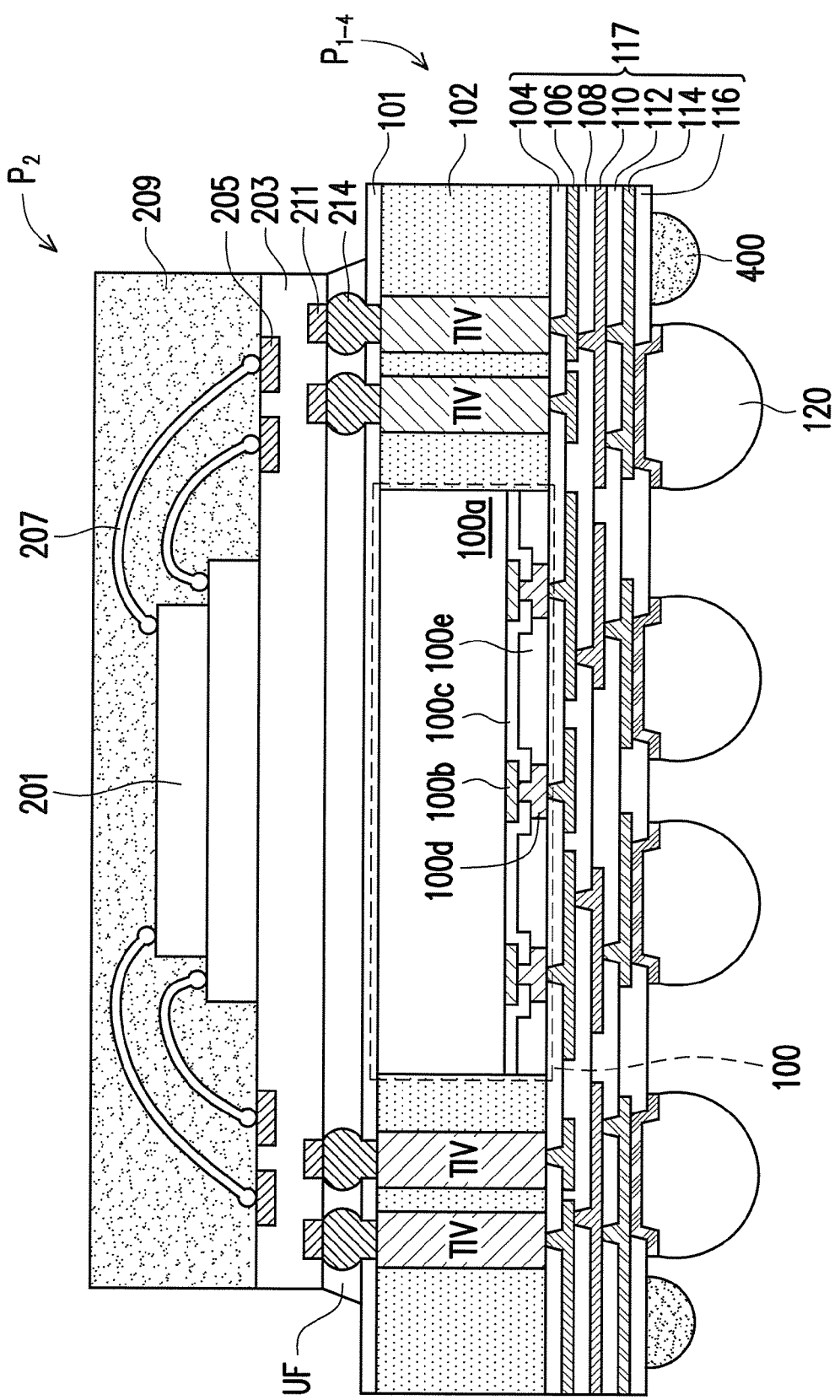
Figure 8E:
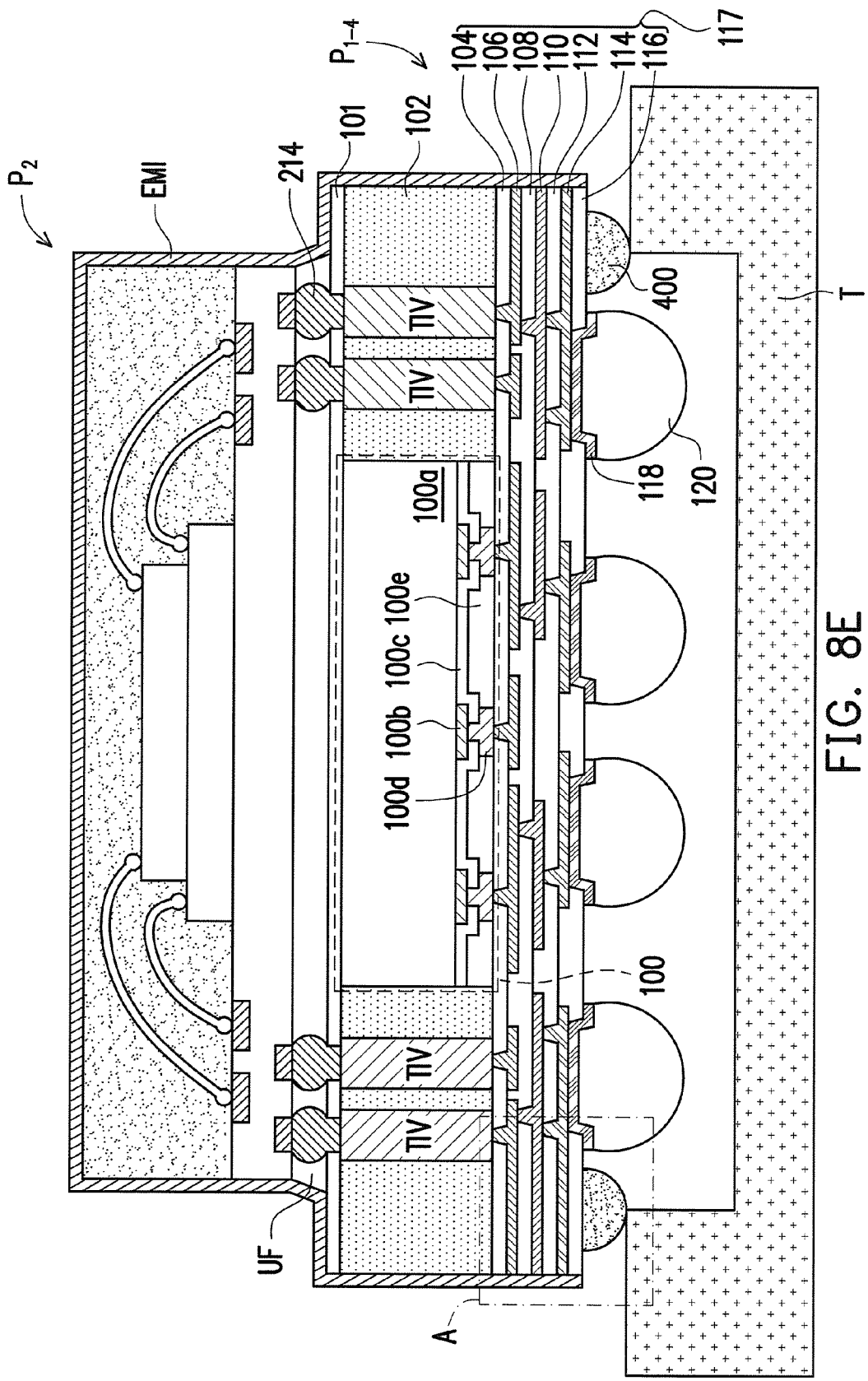
Figure 8F:
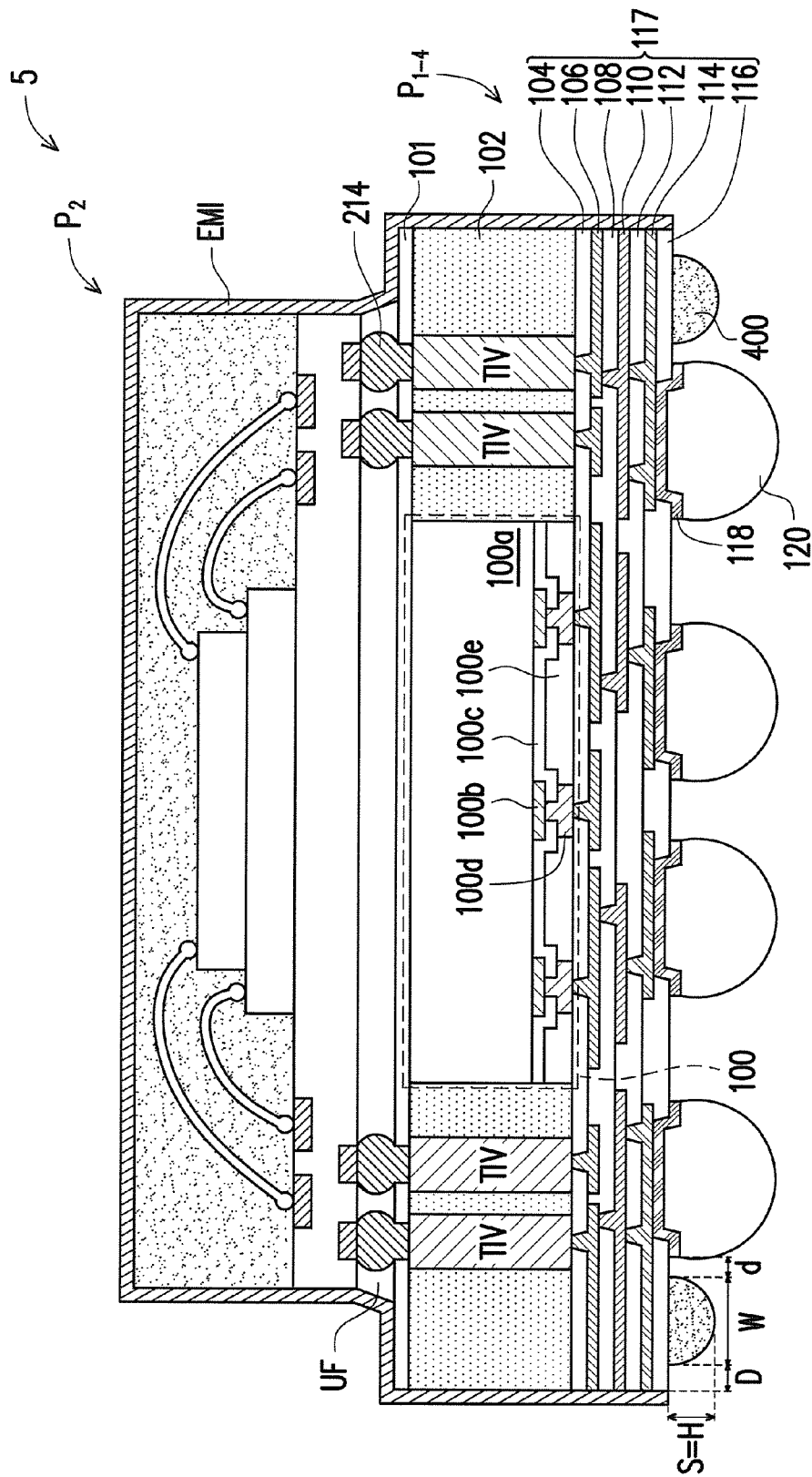

In some embodiments, the outer border of the separator 400 is not aligned with the edge of the package structure $P_{1-4}$, as shown in FIG. 8B. In alternative embodiments, the outer border of the separator 400 is aligned with the edge of the package structure $P_{1-5}/P_{1-6}/P_{1-7}/P_{1-8}$, as shown in FIG. 12 to FIG. 15. As shown in FIG. 12, the outer border of the separator 400 is aligned with the substantial vertical edge of the package structure $P_{1-5}$. As shown in FIG. 13 to FIG. 15, the outer border of the separator 400 is aligned with the adjacent portion of the stepped edge of the package structure $P_{1-6}/P_{1-7}/P_{1-8}$. The stepped edge of the package structure $P_{1-6}/P_{1-7}/P_{1-8}$ is similar to the stepped edge of the package structure $P_{1-1}/P_{1-2}/P_{1-3}$, so the details are not iterated herein.

Referring to FIG. 8D, FIG. 11 and FIGS. 12-15, at step 508, a second package structure (e.g., package structure $P_2$) including a second chip (e.g., chip 201) is bonded to the first package structure.

Referring to FIG. 8E, FIG. 8F, FIG. 11 and FIGS. 12-15, at step 510, an electromagnetic interference layer EMI is formed to cover exposed tops and sidewalls of the first and second package structures. The PoP device 5/6/7/8/9 of the disclosure is thus completed. The enlarged view of the region A in FIG. 10 illustrates the meanings of parameters "d", "W", "D" and "H". The ranges of ratios between the parameters are similar to those described in FIG. 3, so the details are not iterated herein.

It is noted that, in the PoP device 6 in FIG. 12, although the outer border of the separator 400 is aligned to the straight edge of the package structure $P_{1-5}$, the formed electromagnetic interference layer EMI hardly extends along the surface of the separator 400 due to the dome shape thereof, and thus, the formed electromagnetic interference layer EMI is not in contact with the tray during the EMI forming step.

The above embodiments in which the separator is a metal separator or a polymer separator are provided for illustration purposes, and are not construed as limiting the present disclosure. In some embodiments, the separator can be a composite separator containing a conductive material and an insulating material.

Figure 16:
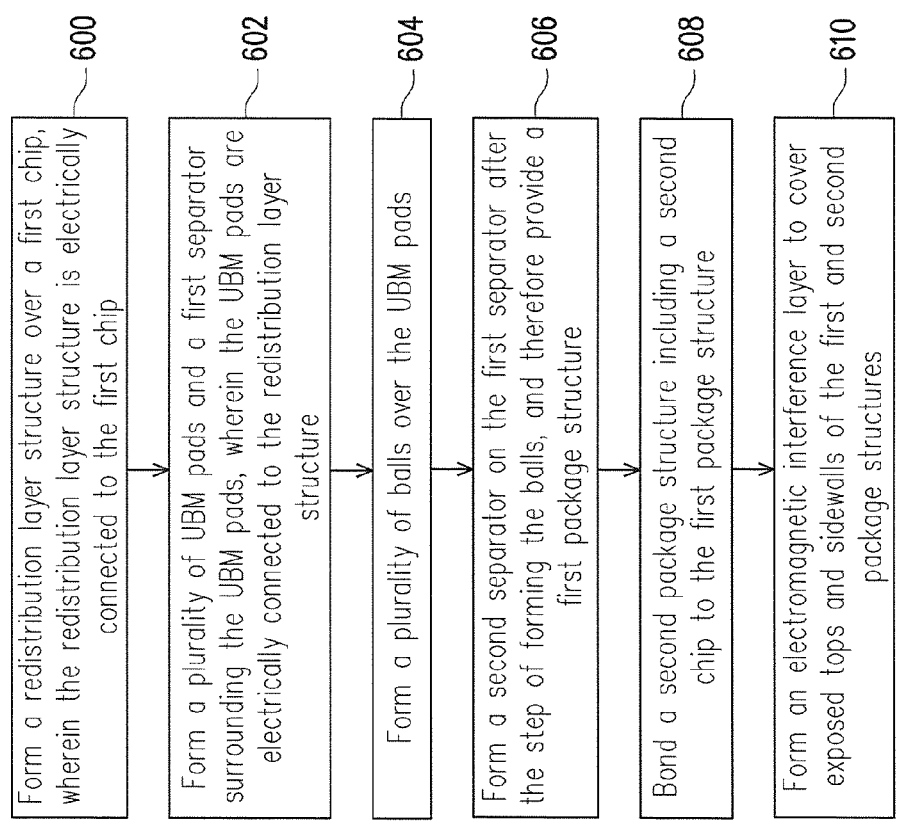
FIG. 16 is a flow chart illustrating a method of forming a PoP device in accordance with yet alternative embodiments.
Figure 17:
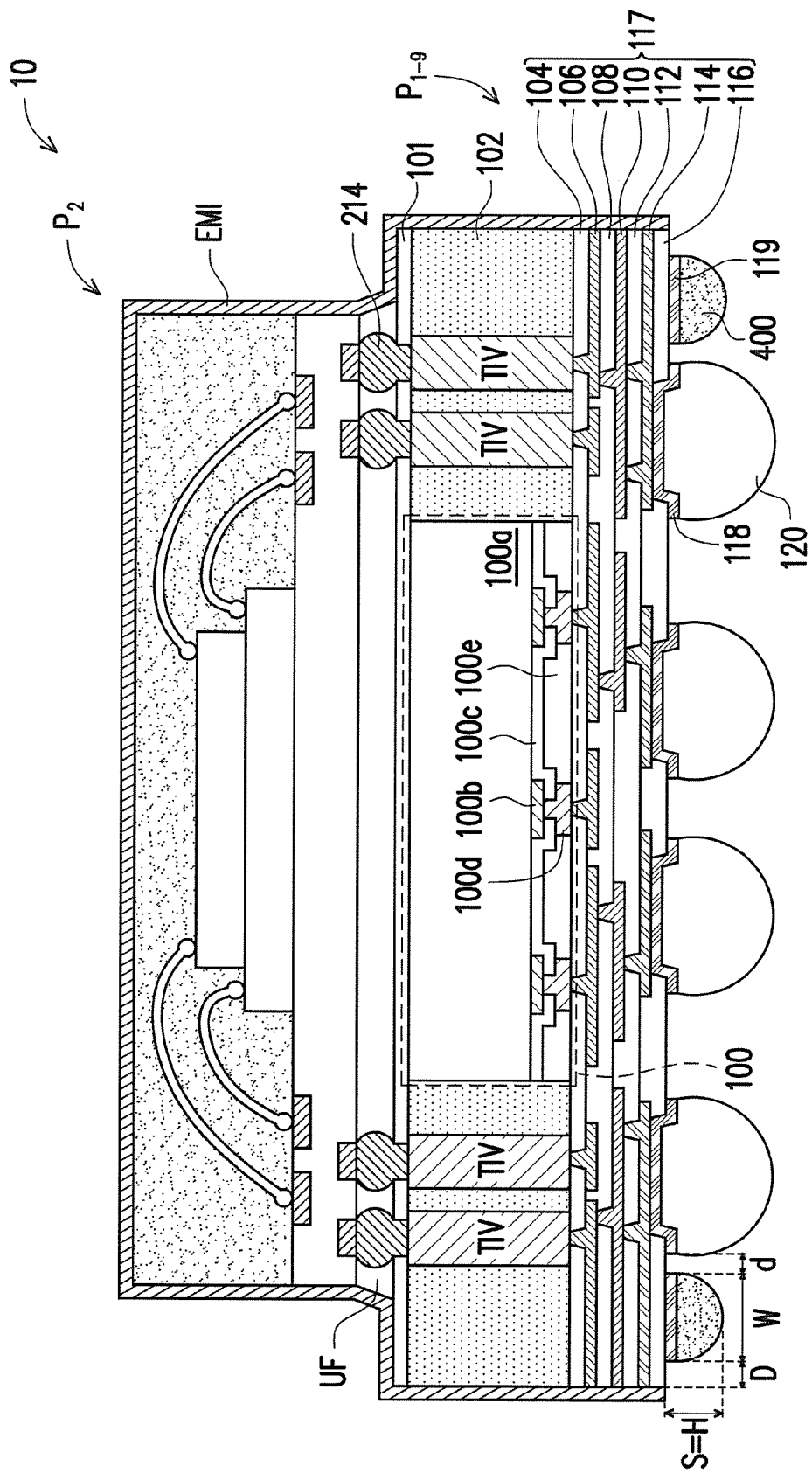
FIG. 17 to FIG. 21 are cross-sectional views of PoP devices in accordance with yet alternative embodiments.
Figure 18:
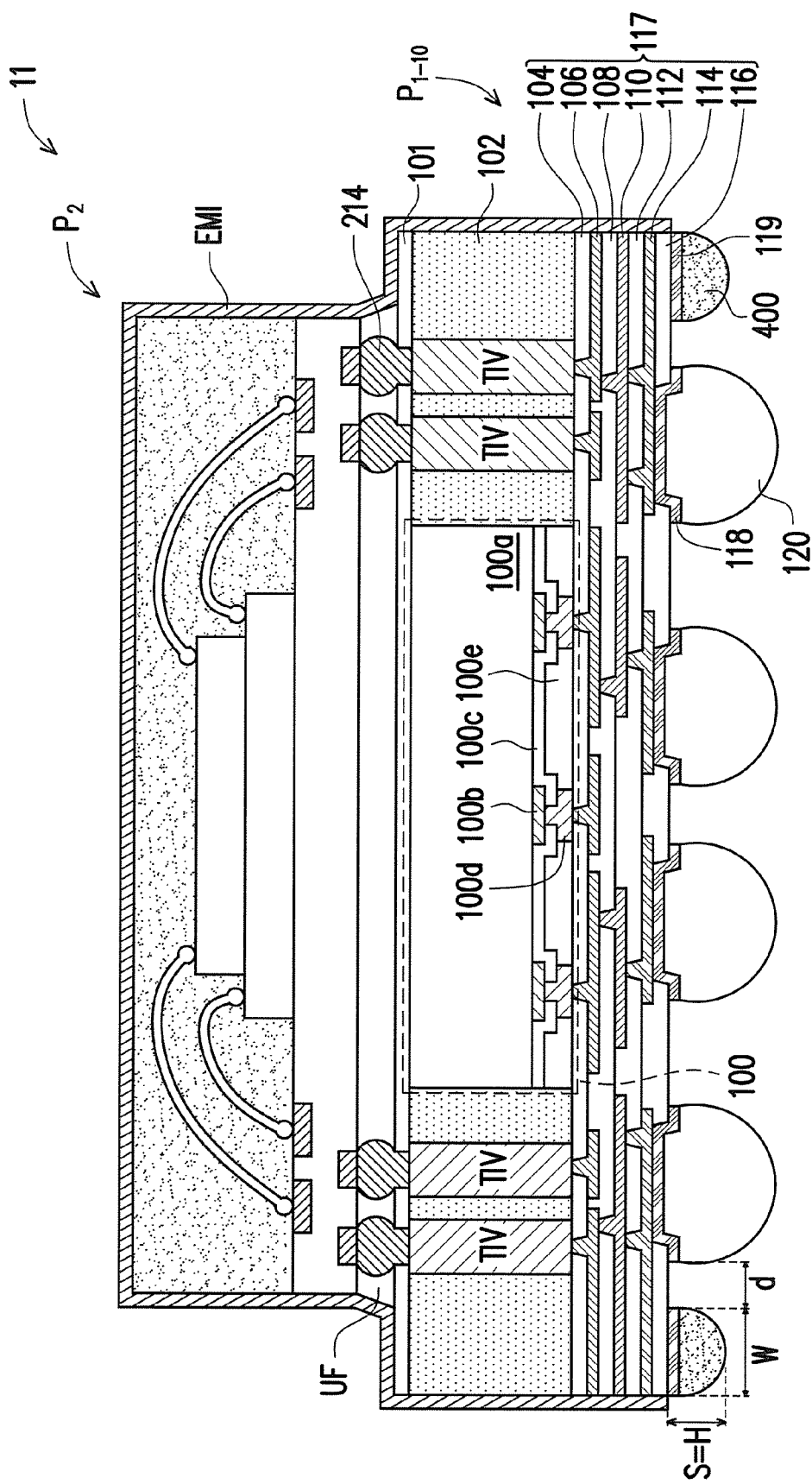
Figure 19:
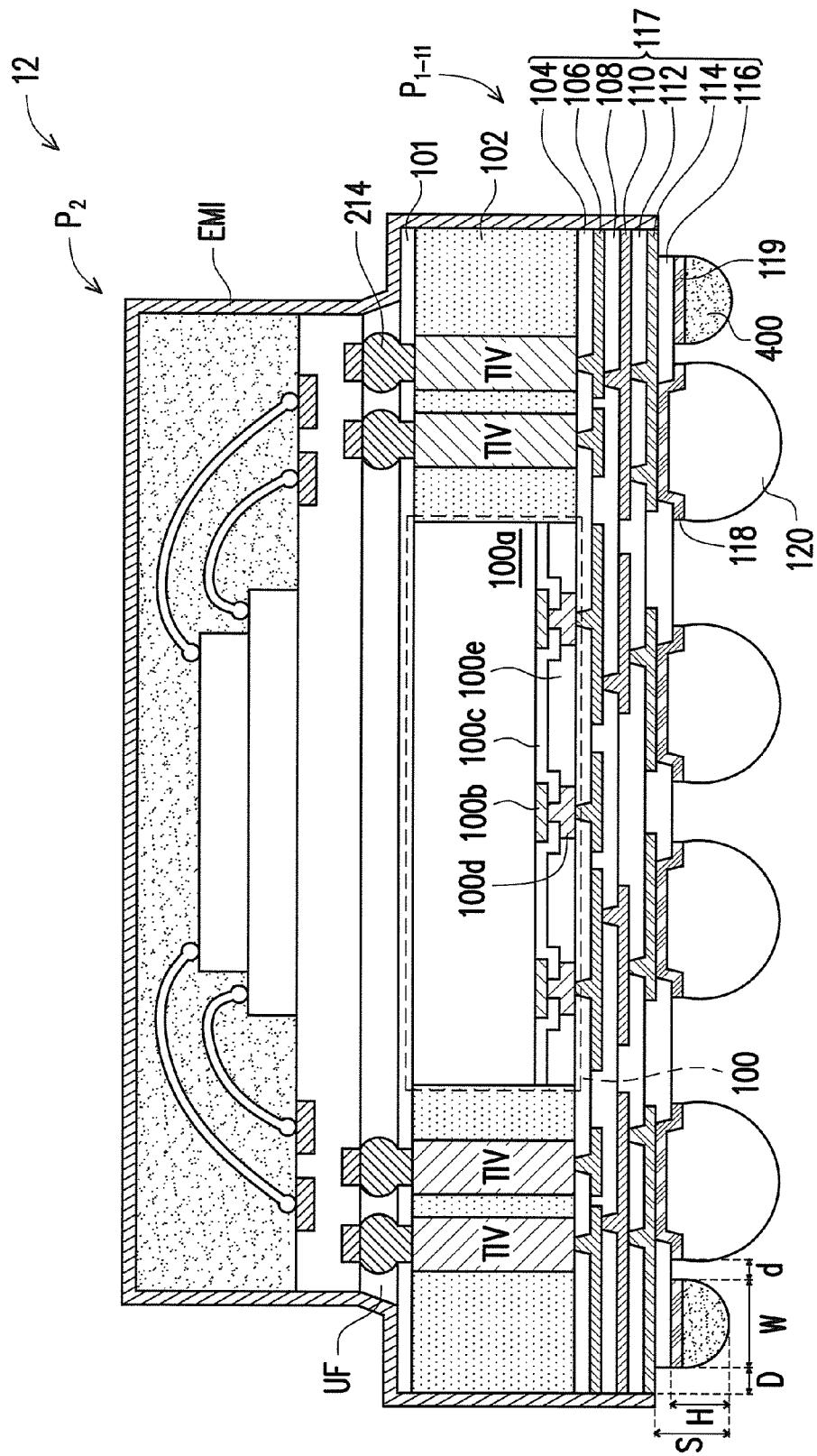
Figure 20:
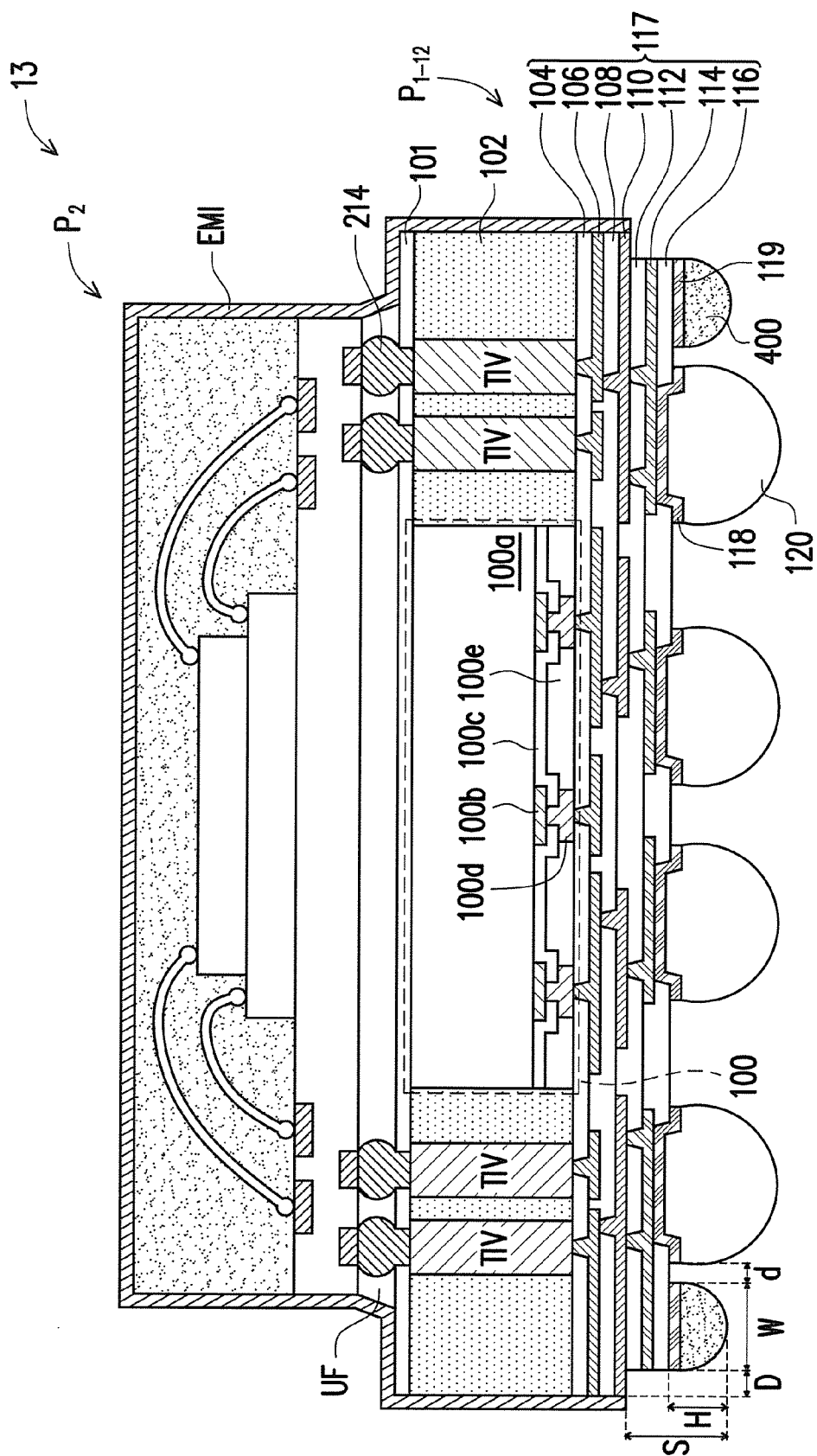
Figure 21:
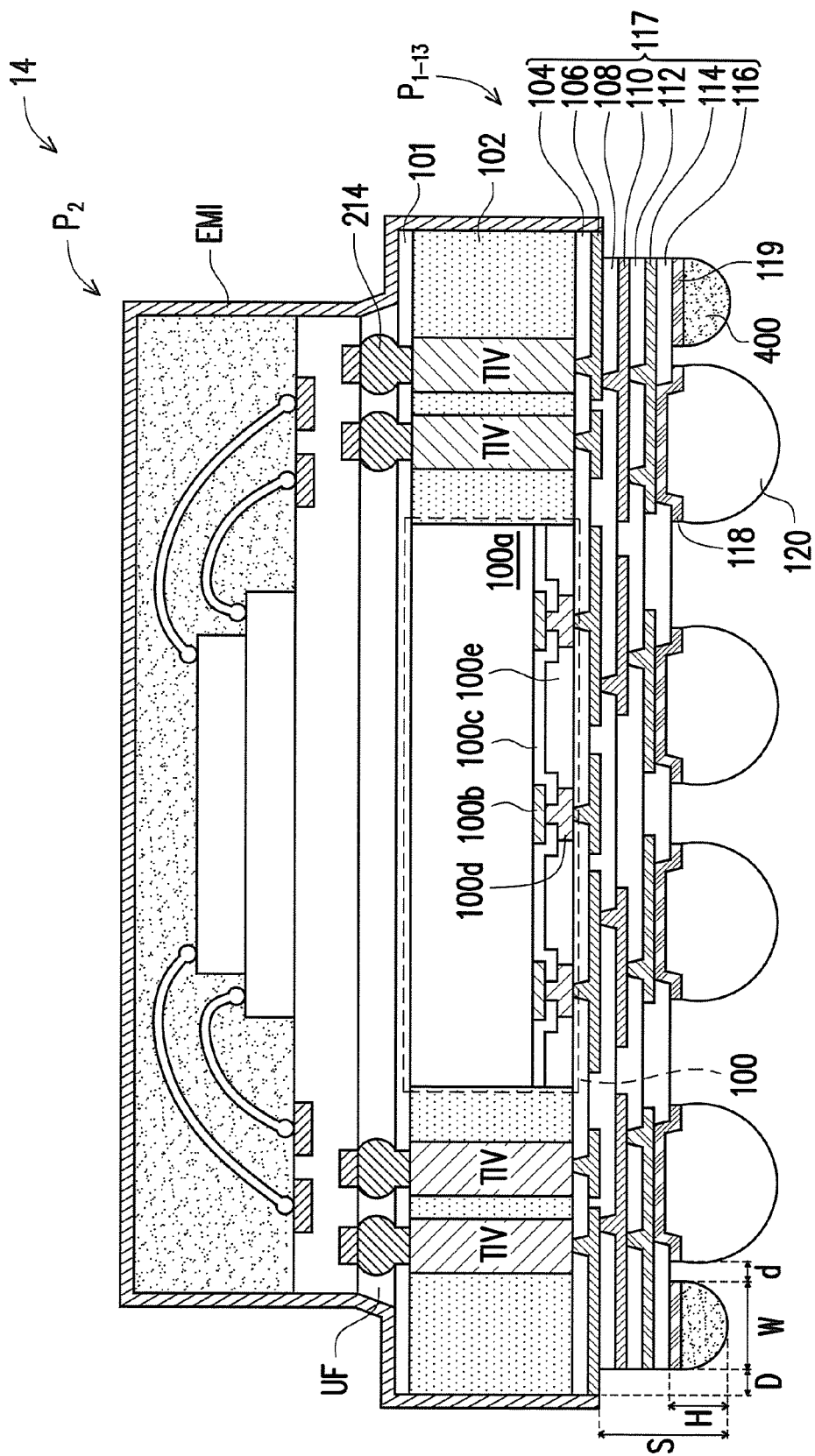

FIG. 16 is a flow chart illustrating a method of forming a PoP device in accordance with yet alternative embodiments. FIG. 17 to FIG. 21 are cross-sectional views of PoP devices in accordance with yet alternative embodiments.

At step 600, a redistribution layer structure 117 is formed over a first chip (e.g., chip 100), wherein the redistribution layer structure 117 is electrically connected to the first chip. At step 602, a plurality of UBM pads 118 and a first separator (e.g., separator 119) surrounding the UBM pads 118 are formed, wherein the UBM pads 118 are electrically connected to the redistribution layer structure 117. At step 604, a plurality of connectors 120 is formed over the UBM pads 120. At step 606, a second separator (e.g., separator 400) is formed on the first separator (e.g., separator 119) after the step of forming the connectors 120, and therefore provide a first package structure (e.g., package structure $P_{1-9}/P_{1-10}/P_{1-11}/P_{1-12}/P_{1-13}$). At step 608, a second package structure (e.g., package structure $P_2$) including a second chip (e.g., chip 201) is bonded to the first package structure. At step 610, an electromagnetic interference layer EMI is formed to cover exposed tops and sidewalls of the first and second package structures. The PoP device 10/11/12/13/14 of the disclosure is thus completed. The ranges of ratios between parameters "d", "W", "D" and "H" are similar to those described in FIG. 3, so the details are not iterated herein.

The PoP device 10/11/12/13/14 as shown in FIGS. 17-21 are similar to the PoP device 5/6/7/8/9 as shown in FIGS. 8F and 12-15, and the difference lies in that the separator in the PoP device 10/11/12/13/14 is a dual-layer structure including a metal separator 119 and a polymer separator 400, while the separator 400 in the PoP device 5/6/7/8/9 is a single-layer structure including a polymer separator 400. The dual-layer separator in the PoP device 10/11/12/13/14 can provide a greater separation distance ("S") between the lower package structure and the tray during the EMI forming step, so as to prevent generation of the conventional EMI burr and therefore to improve the performance of the device.

In some embodiments, the present disclosure provides a package structure $P_1/P_{1-1}/P_{1-2}/P_{1-3}/P_{1-4}/P_{1-5}/P_{1-6}/P_{1-7}/P_{1-8}/P_{1-9}/P_{1-10}/P_{1-11}/P_{1-12}/P_{1-13}$ that includes a chip 100, a redistribution layer structure 117, a plurality of UBM pads 118, a plurality of connectors 120 and a separator 119/400. The package structure $P_1/P_{1-1}/P_{1-2}/P_{1-3}/P_{1-4}/P_{1-5}/P_{1-6}/P_{1-7}/P_{1-8}/P_{1-9}/P_{1-10}/P_{1-11}/P_{1-12}/P_{1-13}$ has a first side (e.g., front side) and a second side (e.g., backside) opposite to the first side. The redistribution layer structure 117 is electrically connected to the chip 100. The UBM pads 118 are electrically connected to the redistribution layer structure 117. The connectors 120 are electrically connected to the UBM pads 118 and exposed from the first side of the package structure. Specifically, a UBM pad 118 is between the redistribution layer structure 117 and each of the connectors 120. The separator 119/400 is on the first side of the package structure and aside the outermost connectors 120. Specifically, the separator 119/400 is over the redistribution layer structure 117 and surrounds the outermost connectors 120.

In the package structure $P_1/P_{1-1}/P_{1-2}/P_{1-3}$, the separator 119 includes a metal. In the package structure $P_{1-4}/P_{1-5}/P_{1-6}/P_{1-7}/P_{1-8}$, the separator 400 includes a polymer. In the package structure $P_{1-9}/P_{1-10}/P_{1-11}/P_{1-12}/P_{1-13}$, the separator member includes a metal separator 119 and a polymer separator 400.

In some embodiments, the present disclosure further provides a PoP device 1/2/3/4/5/6/7/8/9/10/11/12/13/14 that includes a package structure $P_2$ stacked on and bonded to the above package structure $P_1/P_{1-1}/P_{1-2}/P_{1-3}/P_{1-4}/P_{1-5}/P_{1-6}/P_{1-7}/P_{1-8}/P_{1-9}/P_{1-10}/P_{1-11}/P_{1-12}/P_{1-13}$, and an electromagnetic interference layer EMI that covers the top and sidewall of the package structure $P_2$ and is electrically connected to at least one of the redistribution layers 106, 110 and 114 of the redistribution layer structure 117 of the package structure $P_1/P_{1-1}/P_{1-2}/P_{1-3}/P_{1-4}/P_{1-5}/P_{1-6}/P_{1-7}/P_{1-8}/P_{1-9}/P_{1-10}/P_{1-11}/P_{1-12}/P_{1-13}$.

In view of the above, in a PoP device of the present disclosure, a separator is formed over a redistribution layer structure and surrounds the connectors of a package structure. The separator plays a role of separating the PoP device from the tray which holds the bonded structure during the EMI forming step. By such manner, the conventional EMI burr is not observed, and the KOZ for the EMI shielding can be significantly reduced.

In accordance with some embodiments of the present disclosure, a package structure includes a first chip, a redistribution layer structure, a plurality of UBM pads, a plurality of connectors and a separator. The redistribution layer structure is electrically connected to the first chip. The UBM pads are electrically connected to the redistribution layer structure. The connectors are electrically connected to the UBM pads. The separator is over the redistribution layer structure and surrounds the connectors.

In accordance with alternative embodiments of the present disclosure, a PoP device includes a first package structure, a second package structure and an electromagnetic interference layer. The first package structure has a first side and a second side opposite to the first side. The first package structure includes a first chip, a redistribution layer structure, a plurality of connectors and a separator. The redistribution layer structure is electrically connected to the first chip. The connectors are electrically connected to the redistribution layer structure and exposed from the first side. The separator is on the first side of the first package structure and aside the connectors. The second package structure is over the second side of the first package structure. The electromagnetic interference layer covers a top and a sidewall of the second package structure and is electrically connected to the redistribution layer structure of the first package structure.

In accordance with yet alternative embodiments of the present disclosure, a method of forming a package structure includes at least the following steps. A redistribution layer structure is formed over a first chip, wherein the redistribution layer structure is electrically connected to the first chip. A plurality of UBM pads and a first separator are formed, wherein the first separator surrounds the UBM pads, and the UBM pads are electrically connected to the redistribution layer structure. A plurality of connectors is formed over the UBM pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first chip;
   a redistribution layer structure electrically connected to the first chip, wherein the first chip is located on a first side of the redistribution layer structure;
   a plurality of under-ball metallurgy (UBM) pads electrically connected to the redistribution layer structure;
   a plurality of connectors electrically connected to the plurality of UBM pads; and
   a separator over the redistribution layer structure and surrounding the connectors, wherein the plurality of connectors and the separator are located on at a second side of the redistribution layer structure, and the first side is opposite to the second side.

2. The package structure of claim 1, wherein the separator comprises a metal, a polymer or a combination thereof.

3. The package structure of claim 1, wherein a distance from an outermost UBM pad to an inner border of the separator is "d", a width of the separator is "W", and a ratio of d to W ranges from about 1:1 to 1:10.

4. The package structure of claim 1, wherein a distance from an outermost UBM pad to an inner border of the separator is "d", a height of the separator is "H", and a ratio of d to H ranges from about 1:1 to 1:10.

5. The package structure of claim 1, wherein a distance from an outermost UBM pad to an inner border of the separator is "d", a distance from an edge of the package structure to an outer border of the separator is "D", and a ratio of d to D ranges from about 1:0.1 to 1:5.

6. The package structure of claim 1, wherein the separator has a ring shape and surrounds the outmost connectors.

7. The package structure of claim 1, wherein an edge of the package structure has a stepped profile.

8. The package structure of claim 1, wherein the separator is at a floating potential.

9. A PoP device, comprising:
a first package structure, having a first side and a second side opposite to the first side, and comprising:
a first chip;
a redistribution layer structure electrically connected to the first chip;
a plurality of connectors electrically connected to the redistribution layer structure and exposed from the first side; and
a separator on the first side of the first package structure and aside the connectors;
a second package structure, over the second side of the first package structure; and
an electromagnetic interface layer covering a top and a sidewall of the second package structure and electrically connected to the redistribution layer structure of the first package structure.

10. The PoP device of claim 9, wherein the separator comprises a metal, a polymer or a combination thereof.

11. The PoP device of claim 9, wherein the first package structure further comprises a plurality of UBM pads on a top of the redistribution layer structure, and the plurality of connectors are connected to the plurality of UBM pads.

12. The PoP device of claim 11, wherein a distance from an outermost UBM pad to an inner border of the separator is "d", a width of the separator is "W", and a ratio of d to W ranges from about 1:1 to 1:10.

13. The PoP device of claim 11, wherein a distance from an outermost UBM pad to an inner border of the separator is "d", a height of the separator is "H", and a ratio of d to H ranges from about 1:1 to 1:10.

14. The PoP device of claim 11, wherein a distance from an outermost UBM pad to an inner border of the separator is "d", a distance from an edge of the first package structure to an outer border of the separator is "D", and a ratio of d to D ranges from about 1:0.1 to 1:5.

15. The PoP device of claim 9, wherein an outer border of the separator is aligned with an edge of the first package structure.

16. The PoP device of claim 9, wherein an edge of the first package structure has a stepped profile.

17. A method of manufacturing a package structure, comprising:
forming a redistribution layer structure over a first chip, wherein the redistribution layer structure is electrically connected to the first chip, and the first chip is located on a first side of the redistribution layer structure;
forming a plurality of UBM pads and a first separator surrounding the UBM pads, wherein the plurality of UBM pads is electrically connected to the redistribution layer structure; and
forming a plurality of connectors over the plurality of UBM pads, wherein the plurality of connectors and the first separator are located on at a second side of the redistribution layer structure, and the first side is opposite to the second side.

18. The method of claim 17, further comprising forming a second separator on the first separator after the step of forming the plurality of connectors.

19. The method of claim 18, wherein the first separator comprises a metal, and the second separator comprises a polymer.

20. The method of claim 17, wherein the plurality of UBM pads and the first separator are defined by the same photolithography reticle.

* * * * *